(12) United States Patent
Shimoda et al.

(10) Patent No.: US 7,498,733 B2
(45) Date of Patent: Mar. 3, 2009

(54) DISPLAY PANEL

(75) Inventors: Satoru Shimoda, Fussa (JP); Manabu Takei, Sagamihara (JP); Tomoyuki Shirasaki, Higashiyamato (JP); Jun Ogura, Fussa (JP)

(73) Assignee: Casio Computer Co., Ltd., Tokyo (JP)

( * ) Notice: Subject to any disclaimer, the term of this patent is extended or adjusted under 35 U.S.C. 154(b) by 441 days.

(21) Appl. No.: 11/235,605

(22) Filed: Sep. 26, 2005

(65) Prior Publication Data

US 2006/0066219 A1 Mar. 30, 2006

(30) Foreign Application Priority Data

Sep. 29, 2004 (JP) ............................. 2004-283963

(51) Int. Cl.
*H01J 1/62* (2006.01)
(52) U.S. Cl. ........................... 313/500; 345/44; 345/45; 313/505; 315/169.3
(58) Field of Classification Search ....................... None
See application file for complete search history.

(56) References Cited

U.S. PATENT DOCUMENTS

| | | | |
|---|---|---|---|
| 5,684,365 | A | 11/1997 | Tang et al. |
| 6,297,589 | B1 | 10/2001 | Miyaguchi et al. |
| 6,717,357 | B2 | 4/2004 | Okuyama et al. |
| 6,839,057 | B2 | 1/2005 | Iguchi |
| 7,358,529 | B2 | 4/2008 | Childs et al. |
| 7,402,948 | B2 | 7/2008 | Yamazaki et al. |
| 2003/0047730 | A1* | 3/2003 | Konuma ....................... 257/42 |
| 2003/0137325 | A1 | 7/2003 | Yamazaki et al. |
| 2003/0146693 | A1* | 8/2003 | Ishihara et al. ............... 313/504 |
| 2003/0151355 | A1 | 8/2003 | Hosokawa |
| 2003/0168992 | A1 | 9/2003 | Noguchi et al. |
| 2003/0193056 | A1 | 10/2003 | Takayama et al. |
| 2004/0003939 | A1* | 1/2004 | Nishi et al. .................. 174/250 |
| 2004/0160170 | A1 | 8/2004 | Sato et al. |
| 2004/0165003 | A1 | 8/2004 | Shirasaki |
| 2004/0256617 | A1 | 12/2004 | Yamada et al. |
| 2005/0062409 | A1* | 3/2005 | Yamazaki et al. ........... 313/504 |

(Continued)

FOREIGN PATENT DOCUMENTS

CN 1434668 A 8/2003

(Continued)

OTHER PUBLICATIONS

Related U.S. Appl. No. 11/235,579, filed: Sep. 26, 2005; Inventors: Tomoyuki Shirasaki et al; Title: Display Panel.

(Continued)

*Primary Examiner*—Aaron Williams
(74) *Attorney, Agent, or Firm*—Frishauf, Holtz, Goodman & Chick, P.C.

(57) ABSTRACT

A display panel includes a transistor array substrate which has a plurality of transistors including at least a driving transistor, and a plurality of pixel electrodes electrically connected to the driving transistor of the plurality of transistors. A plurality of light-emitting layers are provided on the pixel electrodes. A counter electrode is provided on the light-emitting layers. Each of a plurality of interconnections is arranged between the pixel electrodes adjacent to each other and electrically connected to the counter electrode.

21 Claims, 21 Drawing Sheets

U.S. PATENT DOCUMENTS

| | | | |
|---|---|---|---|
| 2005/0073264 A1* | 4/2005 | Matsumoto | 315/169.3 |
| 2005/0088086 A1* | 4/2005 | Park et al. | 313/506 |
| 2005/0258741 A1* | 11/2005 | Kim et al. | 313/503 |
| 2006/0066535 A1 | 3/2006 | Shirasaki et al. | |

FOREIGN PATENT DOCUMENTS

| | | | |
|---|---|---|---|
| CN | 1437177 | A | 8/2003 |
| EP | 1 331 666 | A2 | 7/2003 |
| EP | 1 349 208 | A1 | 10/2003 |
| JP | 8-330600 | A | 12/1996 |
| JP | 2001-195008 | A | 7/2001 |
| JP | 2002-352963 | A | 12/2002 |
| JP | 2003-076327 | A | 3/2003 |
| JP | 2003-186420 | A | 7/2003 |
| JP | 2003-288994 | A | 10/2003 |
| JP | 2003-317971 | A | 11/2003 |
| JP | 2004-258172 | A | 9/2004 |
| JP | 2006-004731 | A | 1/2006 |
| KR | 2002-0000875 | A | 1/2002 |
| KR | 10-2004-0051611 | A | 6/2004 |
| TW | 591574 | A | 5/2002 |
| TW | 521336 | A | 2/2003 |
| TW | 584824 | A | 4/2004 |
| TW | 594628 | A | 6/2004 |
| WO | WO 03/079441 | A1 | 9/2003 |
| WO | WO 2004/019314 | A1 | 3/2004 |

OTHER PUBLICATIONS

Japanese Office Action (and English translation thereof) dated Apr. 30, 2008 issued in a counterpart Japanese Application in *related* U.S. Appl. No. 11/235,579.

Chinese Office Action (and English translation thereof) dated Jun. 6, 2008, issued in a counterpart Chinese Application.

Chinese Office Action (and English translation thereof) dated Jun. 6, 2008, issued in related U.S. Appl. No. 11/235,579 in counterpart Chinese Application No. 2005800157971.

Japanese Office Action (and English translation thereof) dated Jun. 10, 2008, issued in a counterpart Japanese Application.

Japanese Office Action (and English translation thereof) dated Sep. 9, 2008, issued in a counterpart Japanese Application.

* cited by examiner

DISPLAY PANEL

CROSS-REFERENCE TO RELATED APPLICATIONS

This application is based upon and claims the benefit of priority from prior Japanese Patent Application No. 2004-283963, filed Sep. 29, 2004, the entire contents of which are incorporated herein by reference.

BACKGROUND OF THE INVENTION

1. Field of the Invention

The present invention relates to a display panel using a light-emitting element as a sub-pixel.

2. Description of the Related Art

As described in Jpn. Pat. Appln. KOKAI Publication No. 8-330600, an organic electroluminescent element serving as a light-emitting element has a layered structure in which an anode, electroluminescent layer (to be referred to as an EL layer hereinafter), and cathode are stacked on a substrate in this order. When a voltage is applied between the anode and cathode, holes and electrons are injected in the EL layer so electroluminescence occurs in the EL layer. An electroluminescent element whose substrate and substrate-side electrodes are designed to be optically transparent so that light from the EL layer exits from the substrate with the EL layer is called a bottom emission type. On the other hand, an electroluminescent element designed to output light from the EL layer from the opposite side of the substrate with the EL layer is called a top emission type.

In a display panel of active matrix driving type, one or a plurality of thin-film transistors are provided per 1-dot sub-pixel. The thin-film transistors cause an organic electroluminescent element to emit light. In a display panel described in, e.g., Jpn. Pat. Appln. KOKAI Publication No. 8-330600, two thin-film transistors are provided for each sub-pixel. In manufacturing the display panel of active matrix driving type, a transistor array substrate is prepared by patterning thin-film transistors for each sub-pixel. After that, an organic electroluminescent element is patterned on the surface of the transistor array substrate in correspondence with each sub-pixel. The organic electroluminescent elements are patterned after the thin-film transistors because the temperature in patterning the thin-film transistors is higher than the heatproof temperature of the organic electroluminescent elements.

The thin-film transistors are patterned for each sub-pixel. Hence, the plurality of organic electroluminescent elements are patterned in a matrix such that the lower electrode (e.g., the anode) to be connected to the thin-film transistors is formed independently for each sub-pixel. On the other hand, the counter electrode (e.g., the cathode) is formed on the entire surface as a common electrode shared by all organic electroluminescent elements.

In the above-described apparatus, the EL layers may be damaged by thermal/chemical factors during formation of the counter electrode. To suppress damage to the EL layers, the formation time of the counter electrode is shortened as much as possible. However, when the formation time of the counter electrode is short, the counter electrode becomes thin. When organic electroluminescent elements have the top emission structure, the counter electrode is preferably made as thin as possible such that attenuation of light emitted from the EL layers during passing through the counter electrode is minimized as much as possible.

However, when the counter electrode is made thin, the sheet resistance of the counter electrode increases. When the resistance of the counter electrode is high, the voltage of the counter electrode cannot become uniform in a plane. Hence, the voltage level difference becomes conspicuous in a plane. More specifically, since the counter electrode is formed on the entire surface as a common electrode, the light emission intensity varies between the organic electroluminescent elements even if a voltage of predetermined level is applied to all sub-pixel electrodes. For this reason, the light emission intensity is not uniform in a plane.

BRIEF SUMMARY OF THE INVENTION

The present invention has been made to solve the above-described problem, and has as its object to make it possible to uniform the voltage of the counter electrode as much as possible in a plane even when the counter electrode is thin.

A display panel according to a first aspect of the present invention comprises:

a transistor array substrate which has a plurality of transistors including at least driving transistors;

a plurality of pixel electrodes which are electrically connected to said plurality of driving transistors of said plurality of transistors;

a plurality of light-emitting layers each of which is provided on each of the pixel electrodes;

a counter electrode which is provided on the light-emitting layers; and a plurality of interconnections each of which is arranged between the pixel electrodes adjacent to each other and electrically connected to the counter electrode.

A display panel according to a second aspect of the present invention comprises:

a transistor array substrate which has a plurality of transistors including driving transistors;

a plurality of pixel electrodes which are electrically connected to the driving transistors of said plurality of transistors;

a plurality of light-emitting layer each of which is provided on each of the pixel electrodes;

a counter electrode which is provided on the light-emitting layer; and a plurality of interconnections which is formed from a conductive layer different from a conductive layer serving as the pixel electrode, a layer serving as sources and drains of said plurality of transistors, and a layer serving as gates, arranged between the pixel electrodes adjacent to each other, and connected to the counter electrode.

A display panel according to a third aspect of the present invention comprises:

a plurality of pixel electrodes;

a plurality of light-emitting layers which are provided on said plurality of pixel electrodes;

a counter electrode which is provided on each of said plurality of light-emitting layers;

a plurality of driving transistors which are electrically connected to said plurality of pixel electrodes, respectively;

a plurality of switch transistors each of which supplies a write current to a drain-to-source path of corresponding one of said plurality of driving transistors;

a plurality of holding transistors each of which holds a gate voltage of corresponding one of said plurality of driving transistors;

a plurality of common interconnection each of which is arranged between adjacent two of said plurality of pixel electrodes and electrically connected to the counter electrode; and a plurality of signal lines each of which is electrically connected to the switch transistor while being arranged without overlapping the common interconnection.

DETAILED DESCRIPTION OF THE INVENTION

According to the present invention, the counter electrode and common interconnections are connected. For this reason, even when the counter electrode itself is made thin and has a high resistance, the voltage of the counter electrode can be uniformed in a plane. In addition, since the counter electrode can be made thinner, in a top emission structure, light emitted from the organic EL layer hardly attenuates while passing through the counter electrode.

The common interconnections formed under the counter electrode are patterned independently of the gates, sources, and drains of transistors. For this reason, the common interconnections can be thick and have a low resistance. Hence, the voltage of the counter electrode can be uniformed in a plane.

The best mode for carrying out the present invention will be described below with reference to the accompanying drawing. Various kinds of limitations which are technically preferable in carrying out the present invention are added to the embodiments to be described below. However, the spirit and scope of the present invention are not limited to the following embodiments and illustrated examples. In the following description, the term "electroluminescence" will be abbreviated as EL.

[Planar Layout of Display Panel]

Figure 1:
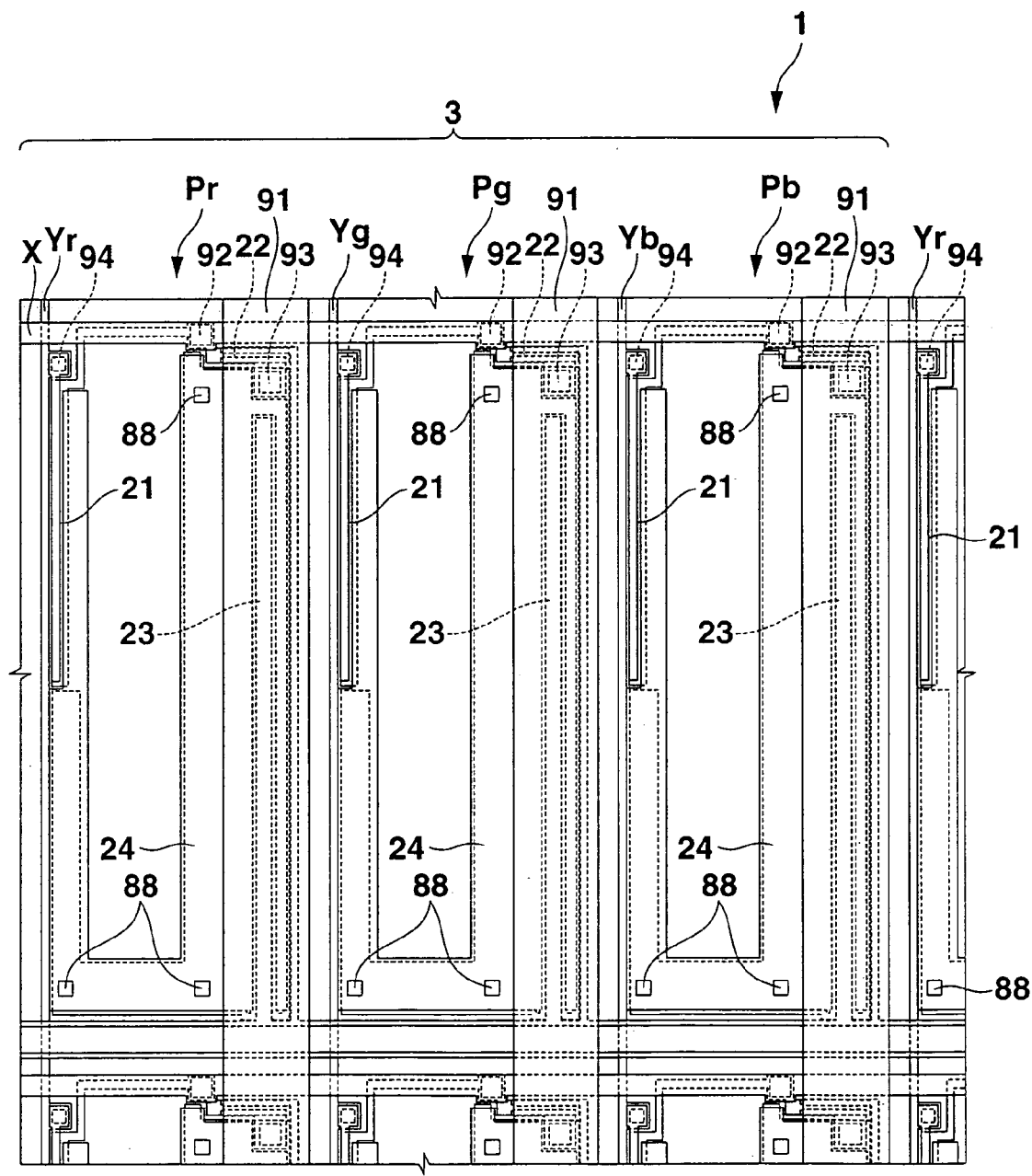
FIG. 1 is a plan view showing a pixel of a display panel 1.

FIG. 1 is a schematic plan view showing a pixel 3 of a color display panel 1 which is operated by the active matrix driving method. In the display panel 1, a 1-dot red sub-pixel Pr, 1-dot green sub-pixel Pg, 1-dot blue sub-pixel Pb are arrayed adjacent in the horizontal direction in correspondence with one pixel 3. In the display panel 1, the pixels 3 are arrayed in a matrix. The sub-pixels Pr, Pg, and Pb are arrayed in the vertical direction (column direction) such that sub-pixels of one column are of the same color. The red sub-pixel Pr, green sub-pixel Pg, and blue sub-pixel Pb are repeatedly arranged in the horizontal direction (row direction) in this order. The sub-pixels Pr, Pg, and Pb are arrayed in a matrix all over. More specifically, the sub-pixels Pr, Pg, and Pb corresponding to m (m is a natural number; m≧2) dots are arrayed in the vertical direction all over while the sub-pixels Pr, Pg, and Pb corresponding to n (n is an integer multiple of 3) dots are arrayed in the horizontal direction. In the following description, an arbitrary one of the red sub-pixel Pr, green sub-pixel Pg, and blue sub-pixel Pb is represented by a sub-pixel P. The description of the sub-pixel P applies to all the red sub-pixel Pr, green sub-pixel Pg, and blue sub-pixel Pb. The first subscript added to the sub-pixel P represents the sequence from the top of the display panel 1, and the second subscript represents the sequence from the left of the display panel 1. More specifically, let i be an arbitrary natural number of 1 to m, and j be an arbitrary natural number of 1 to n. A sub-pixel $P_{i,j}$ is located on the ith row from the top and the jth column from the left.

A signal line Yr runs along a column of the red sub-pixels Pr in the vertical direction. A signal line Yg runs along a column of the green sub-pixels Pg in the vertical direction. A signal line Yb runs along a column of the blue sub-pixels Pb in the vertical direction. The signal line Yr supplies a signal to all the red sub-pixels Pr of one column of pixels 3 in the vertical direction. The signal line Yg supplies a signal to all the green sub-pixels Pg of one column of pixels 3 in the vertical direction. The signal line Yb supplies a signal to all the blue sub-pixels Pb of one column of pixels 3 in the vertical direction. In the following description, the description of a signal line Y applies to all the signal lines Yr, Yg, and Yb. The subscript added to the signal line Y represents the sequence from the left of the display panel 1. More specifically, a signal line $Y_j$ is the jth column from the left.

A common interconnection 91 runs along each of the columns of the red sub-pixels Pr, the columns of the green sub-pixels Pg, and the columns of the blue sub-pixels Pb in the vertical direction. That is, one common interconnection 91 runs in the vertical direction in correspondence with one column of the sub-pixels P in the vertical direction.

One scan line X, one supply line Z, and one feed interconnection 90 run in the horizontal direction in correspondence with one row of the pixels 3 in the horizontal direction. When viewed from the upper side, the feed interconnection 90 overlaps the supply line Z. The subscript added to the scan line X represents the sequence from the top of the display panel 1. The subscript added to the supply line Z represents the sequence from the top of the display panel 1. More specifically, a scan line $X_i$ is the ith row from the top, and a supply line $Z_i$ is the ith row from the top.

Figure 7:
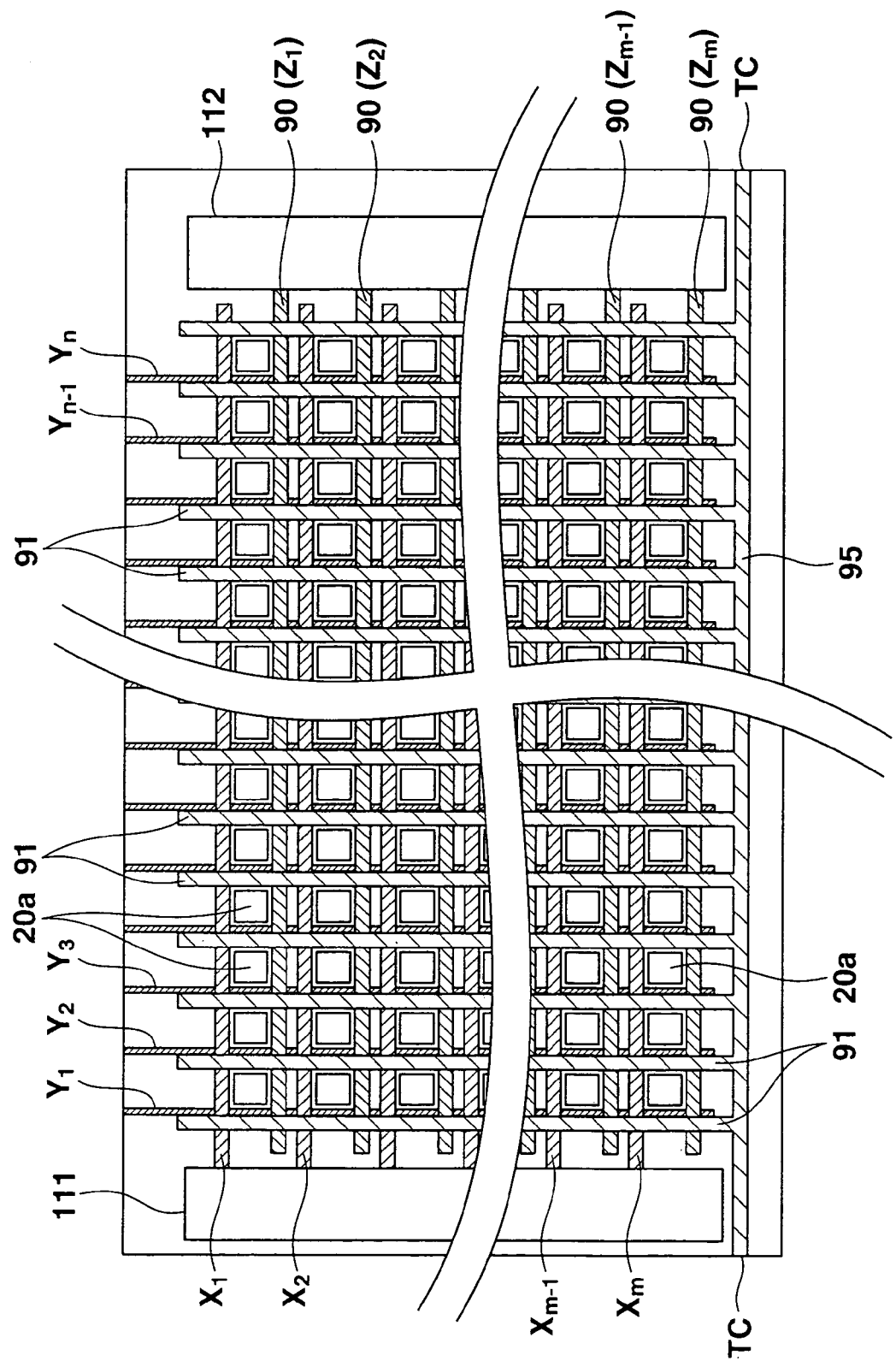
FIG. 7 is a schematic plan view showing the interconnection structure of the display panel.
Figure 9:
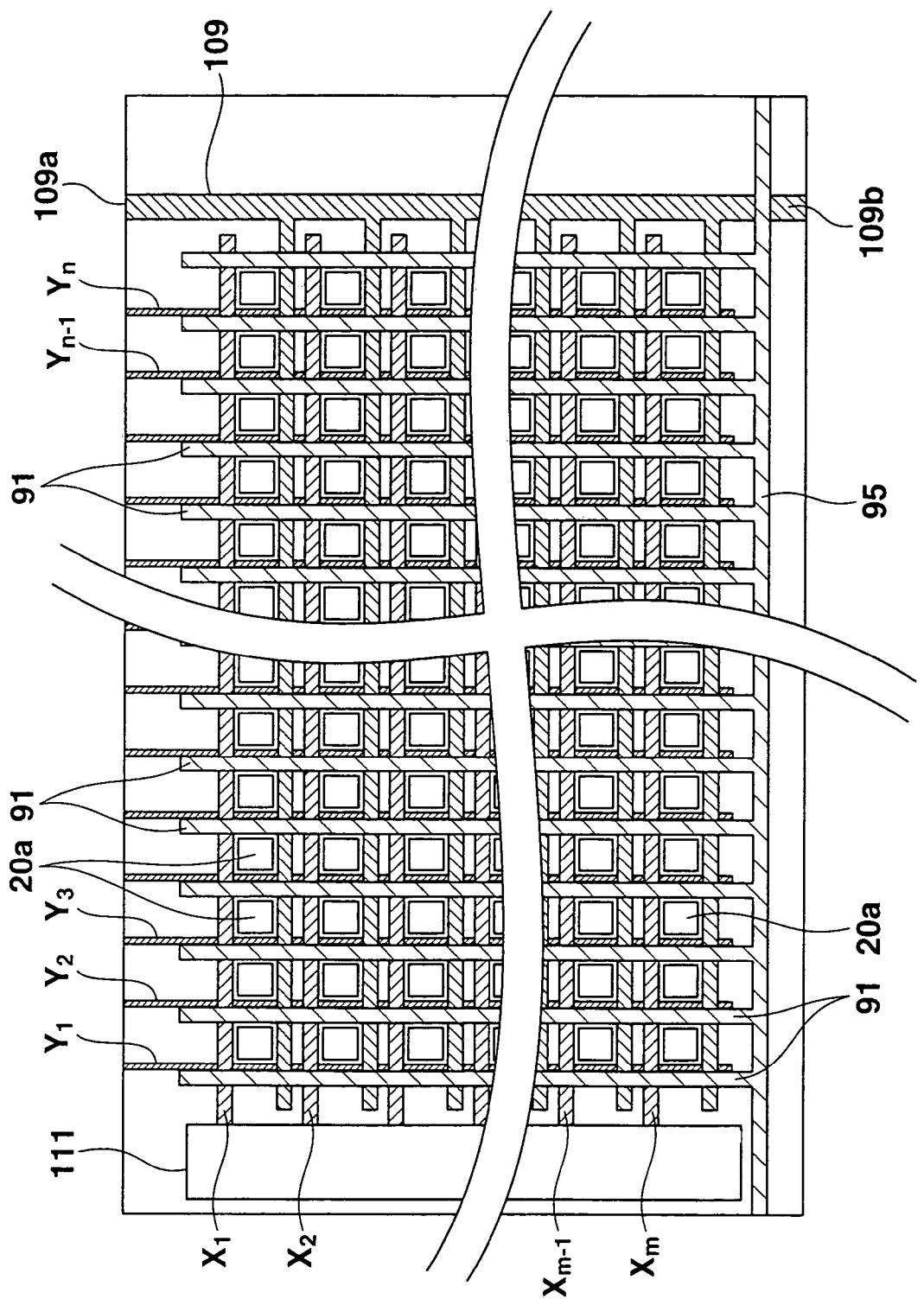
FIG. 9 is a schematic plan view showing the interconnection structure of another display panel.

The color of each the sub-pixels Pr, Pg, and Pb is determined by the color of light emitted from an organic EL element 20 (for example, FIG. 2) (to be described later). When the entire display panel 1 is viewed from the upper side, a plurality of sub-pixel electrodes 20a which are anodes of the EL elements 20 are arrayed in a matrix. The 1-dot sub-pixel P is determined by one sub-pixel electrode 20a. In the entire display panel 1, the columns of the sub-pixel electrodes 20a are arrayed along one side of signal lines $Y_1$ to $Y_n$, as shown in FIG. 7 or 9. The total number of columns of sub-pixel electrodes 20a in the vertical direction is n. Each sub-pixel electrode 20a is surrounded by the common interconnections 91 on both sides in the horizontal direction. For this reason, the number of common interconnections 91 is (n+1). As will be described later in detail, the common interconnection 91 of the kth column ($2 \leq k \leq n+1$) covers transistors 22 and 23 of the sub-pixels P of the (k−1)th column when viewed from the upper side.

[Circuit Arrangement of Sub-Pixel]

Figure 2:
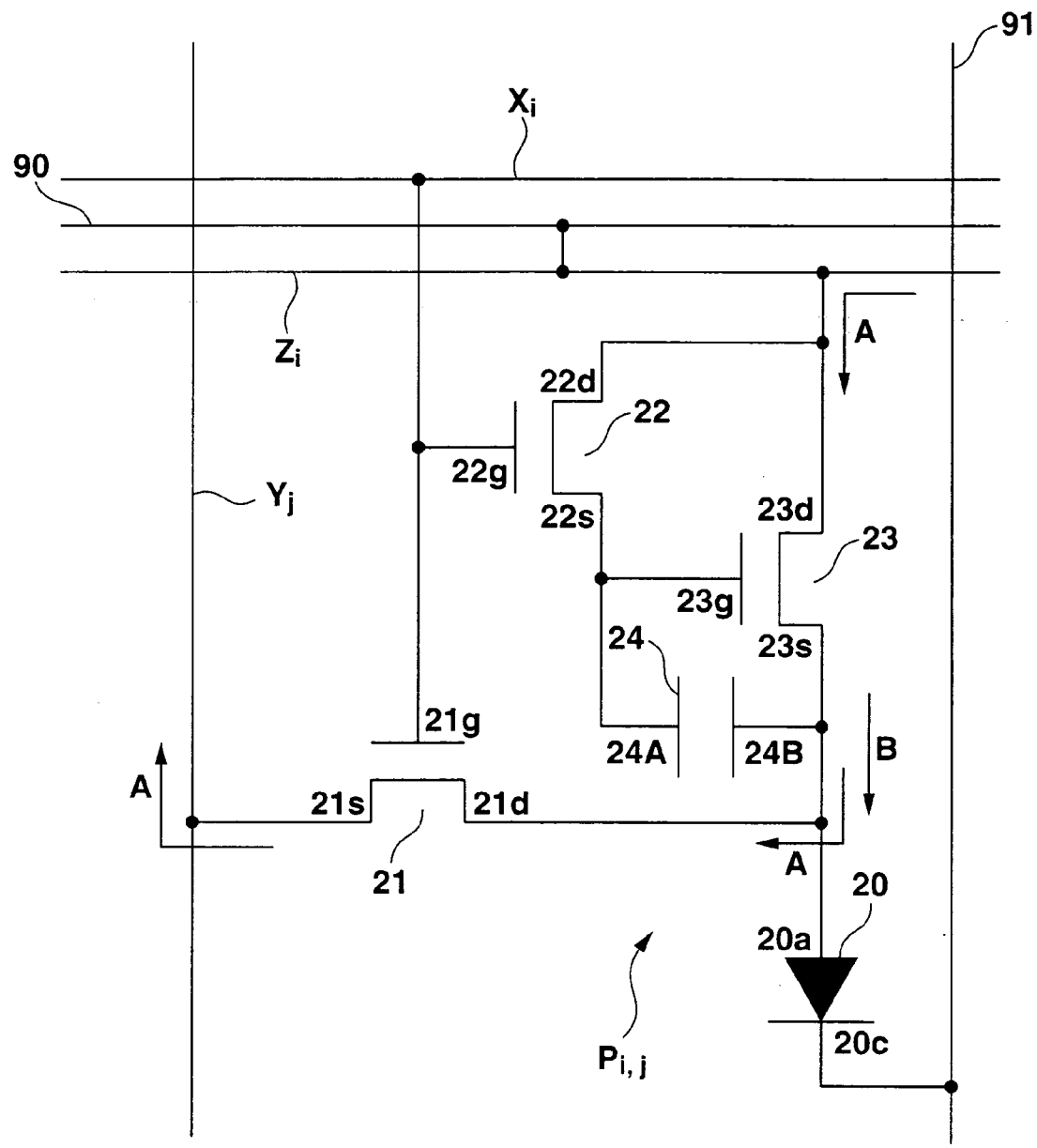
FIG. 2 is an equivalent circuit diagram of a sub-pixel P of the display panel 1.

The circuit arrangement of the sub-pixels Pr, Pg, and Pb will be described next with reference to FIG. 2. FIG. 2 is an equivalent circuit diagram of the sub-pixel $P_{i,j}$ of the ith row and jth column.

All the sub-pixels Pr, Pg, and Pb have the same arrangement. The organic EL element 20, first to three N-channel amorphous silicon thin-film transistors (to be simply referred to as transistors hereinafter) 21, 22, and 23, and a capacitor 24 are provided for the 1-dot sub-pixel P. The first transistor 21 will be referred to as the switch transistor 21, the second transistor 22 will be referred to as the holding transistor 22, and the third transistor 23 will be referred to as the driving transistor 23 hereinafter.

In the switch transistor 21, a source 21s is electrically connected to the signal line Y. A drain 21d is electrically connected to the sub-pixel electrode 20a of the organic EL element 20, a source 23s of the driving transistor 23, and an upper electrode 24B of the capacitor 24. A gate 21g is electrically connected to a gate 22g of the holding transistor 22 and the scan line X.

In the holding transistor 22, a source 22s is electrically connected to a gate 23g of the driving transistor 23 and a lower electrode 24A of the capacitor 24. A drain 22d is electrically connected to a drain 23d of the driving transistor 23 and the supply line Z. The gate 22g is electrically connected to the gate 21g of the switch transistor 21 and the scan line X.

In the driving transistor 23, the source 23s is electrically connected to the sub-pixel electrode 20a of the organic EL element 20, the drain 21d of the switch transistor 21, and the upper electrode 24B of the capacitor 24. The drain 23d is electrically connected to the drain 22d of the holding transistor 22 and the supply line Z. The gate 23g is electrically connected to the source 22s of the holding transistor 22 and the lower electrode 24A of the capacitor 24.

A counter electrode 20c (one continuous common counter electrode or a plurality of divided counter electrodes) serving as the cathode of the organic EL element 20 is electrically connected to the common interconnection 91. The counter electrode 20c is a common electrode shared by all the sub-pixels Pr, Pg, and Pb. This will be described later in detail.

In all the red sub-pixels Pr arrayed in a column in the vertical direction, the sources 21s of the switch transistors 21 are electrically connected to the common signal line Yr. In all the green sub-pixels Pg arrayed in a column in the vertical direction, the sources 21s of the switch transistors 21 are electrically connected to the common signal line Yg. In all the blue sub-pixels Pb arrayed in a column in the vertical direction, the sources 21s of the switch transistors 21 are electrically connected to the common signal line Yb.

In all the sub-pixels Pr, Pg, and Pb arrayed in one row in the horizontal direction, the gates 21g of the switch transistors 21 are electrically connected to the common scan line X. The gates 22g of the holding transistors 22 are electrically connected to the common scan line X.

Figure 3:
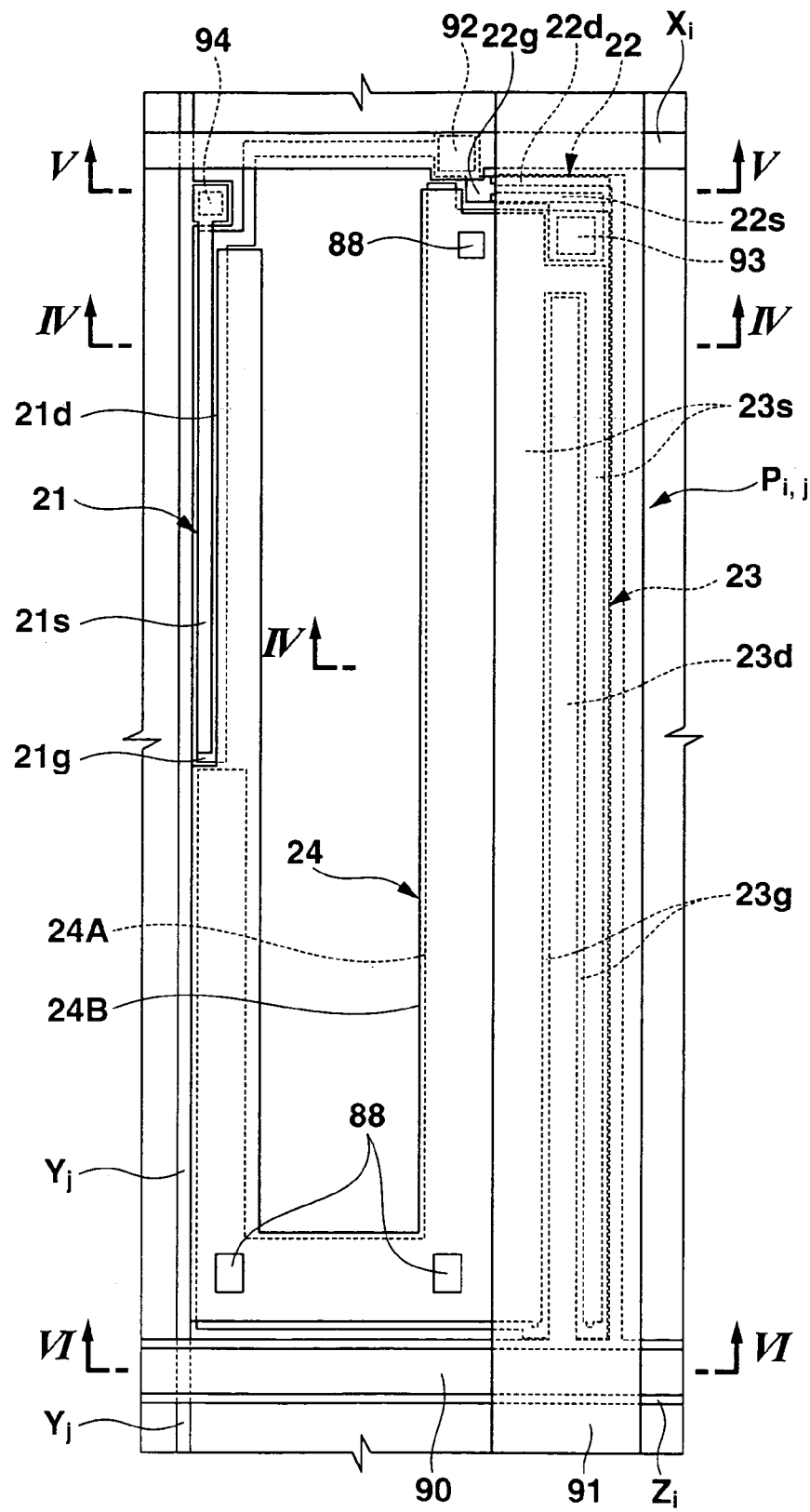
FIG. 3 is a plan view showing the electrodes of the sub-pixel P.

The planar layout of the sub-pixel P will be described with reference to FIG. 3. FIG. 3 is a plan view mainly showing the electrodes of the sub-pixel P. For the illustrative convenience, FIG. 3 does not illustrate the sub-pixel electrode 20a and counter electrode 20c of the organic EL element 20.

As shown in FIG. 3, when viewed from the upper side, the switch transistor 21 is arranged along the signal line Y. The holding transistor 22 is arranged along the scan line X. The driving transistor 23 is arranged along the adjacent signal line Y.

When a focus is placed on only the switch transistors 21 of all the sub-pixels Pr, Pg, and Pb in the entire display panel 1 viewed from the upper side, the plurality of switch transistors 21 are arrayed in a matrix. When a focus is placed on only the holding transistors 22 of all the sub-pixels Pr, Pg, and Pb, the plurality of holding transistors 22 are arrayed in a matrix. When a focus is placed on only the driving transistors 23 of all the sub-pixels Pr, Pg, and Pb, the plurality of driving transistors 23 are arrayed in a matrix.

In the columns of the red sub-pixels Pr, the columns of the green sub-pixels Pg, and the columns of the blue sub-pixels Pb in the vertical direction, the plurality of holding transistors 22 arrayed in the vertical direction are covered with the common interconnections 91. In the columns of the red sub-pixels Pr, the columns of the green sub-pixels Pg, and the columns of the blue sub-pixels Pb in the vertical direction, the plurality of driving transistors 23 arrayed in the vertical direction are covered with the common interconnections 91. Each holding transistor 22 may be covered with the common interconnection 91 entirely or partially by making the common interconnection 91 narrower.

[Layer Structure of Display Panel]

Figure 4:
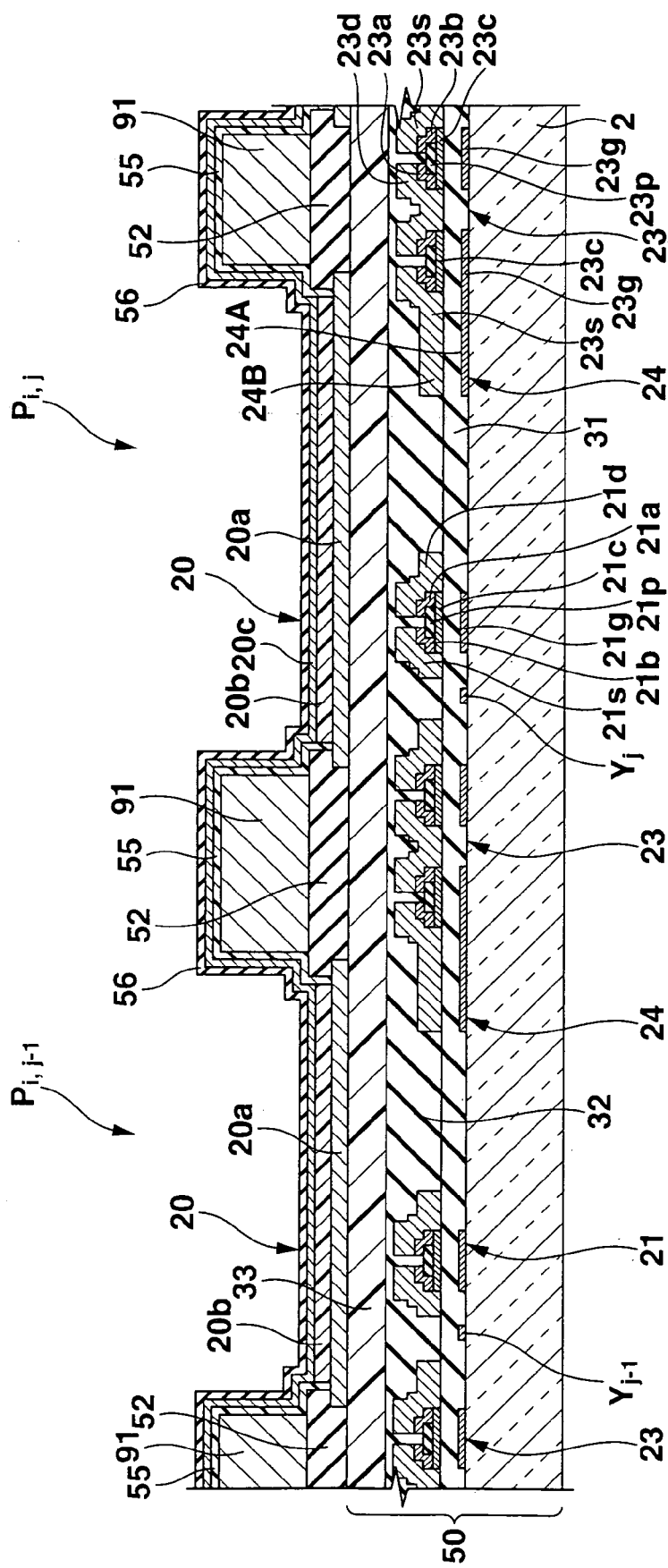
FIG. 4 is a sectional view taken along a line IV-IV in FIG. 3.
Figure 5:
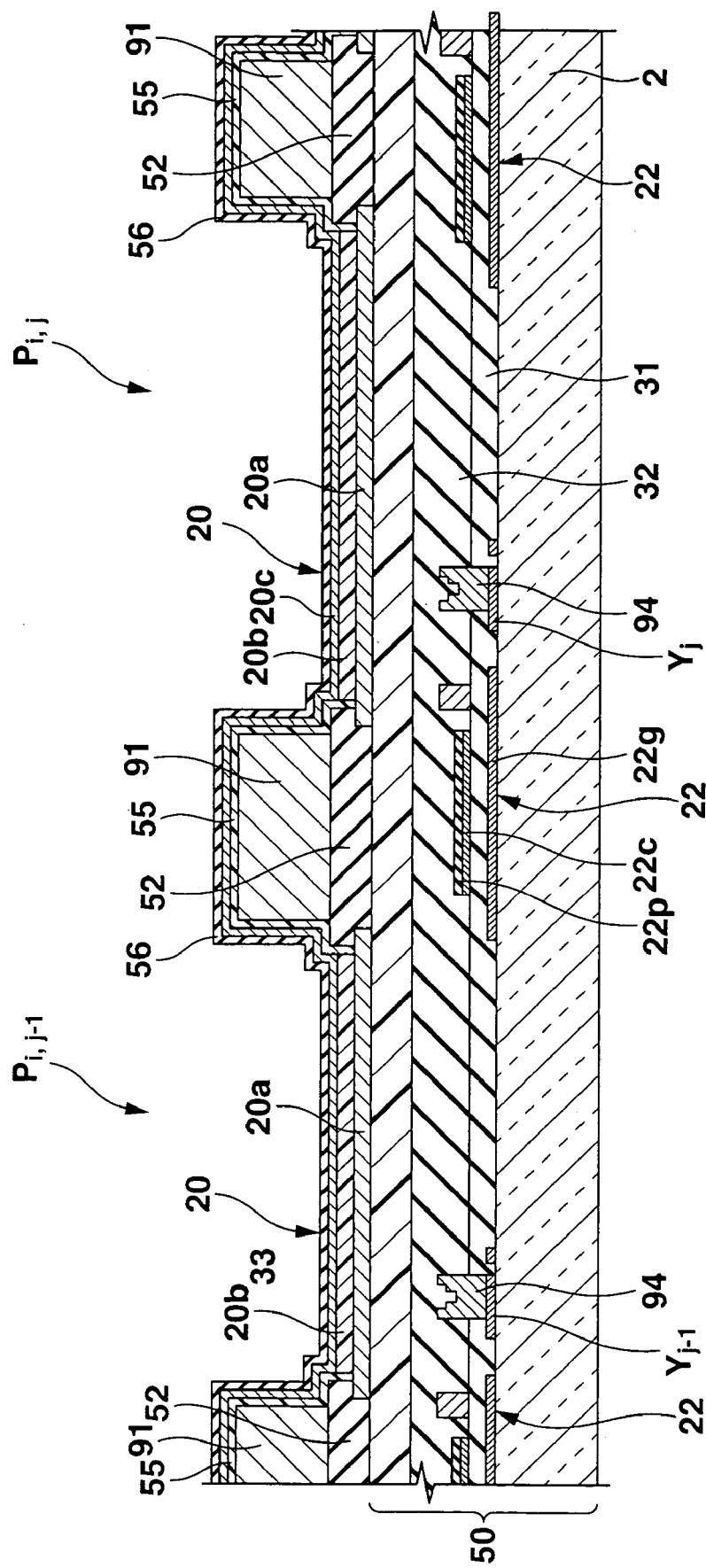
FIG. 5 is a sectional view taken along a line V-V in FIG. 3.
Figure 6:
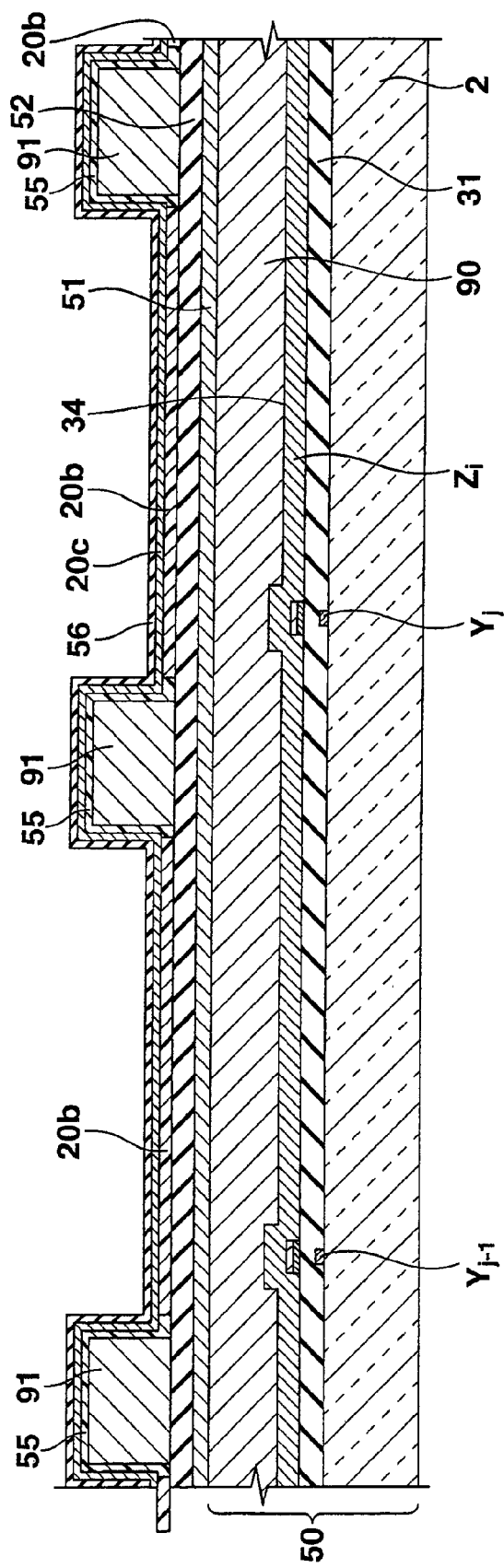
FIG. 6 is a sectional view taken along a line VI-VI in FIG. 3.

The layer structure of the display panel 1 will be described with reference to FIGS. 4 to 6. FIG. 4 is a sectional view taken along a line IV-IV in FIG. 3. FIG. 5 is a sectional view taken along a line V-V in FIG. 3. FIG. 6 is a sectional view taken along a line VI-VI in FIG. 3. FIG. 3 shows the 1-dot sub-pixel P. FIGS. 4 to 6 show the sub-pixels P of two dots adjacent in the horizontal direction.

The display panel 1 is formed by stacking various kinds of layers on the insulating substrate 2 which is optically transparent. The insulating substrate 2 has a flexible sheet shape or a rigid plate shape.

The layer structure of the first to third transistors 21 to 23 will be described. As shown in FIG. 4, the switch transistor 21 includes the gate 21g, a semiconductor film 21c, a channel protective film 21p, impurity-doped semiconductor films 21a and 21b, the drain 21d, and the source 21s. The gate 21g is formed on the insulating substrate 2. The semiconductor film 21c opposes the gate 21g via part of a gate insulating film 31 formed on the gate 21g. The channel protective film 21p is formed on the central portion of the semiconductor film 21c. The impurity-doped semiconductor films 21a and 21b are formed on two ends of the semiconductor film 21c to be spaced apart from each other and partially overlap the channel protective film 21p. The drain 21d is formed on the impurity-doped semiconductor film 21a. The source 21s is formed on the impurity-doped semiconductor film 21b. The drain 21d and source 21s can have either a single-layer structure or a layered structure including two or more layers.

The driving transistor 23 includes the gate 23g, a semiconductor film 23c, a channel protective film 23p, impurity-doped semiconductor films 23a and 23b, the drain 23d, and the source 23s. The gate 23g is formed on the insulating substrate 2. The semiconductor film 23c opposes the gate 23g via part of the gate insulating film 31 formed on the gate 23g. The channel protective film 23p is formed on the central portion of the semiconductor film 23c. The impurity-doped semiconductor films 23a and 23b are formed on two ends of the semiconductor film 23c to be spaced apart from each other and partially overlap the channel protective film 23p. The drain 23d is formed on the impurity-doped semiconductor film 23a. The source 23s is formed on the impurity-doped semiconductor film 23b. When viewed from the upper side as shown in FIG. 3, the driving transistor 23 is formed into an interdigital shape so that the channel width is large. The drain 23d and source 23s can have either a single-layer structure or a layered structure including two or more layers.

The sectional view of the holding transistor 22 taken along a plane parallel to the channel length direction is not illustrated. The sectional view in FIG. 5 parallel to the channel width direction shows the gate 22g, a semiconductor film 22c, and a channel protective film 22p of the holding transistor 22. The holding transistor 22 has the same layer structure as the driving transistor 23. In all the sub-pixels Pr, Pg, and Pb, the switch transistor 21, holding transistor 22, and driving transistor 23 have the same layer structures as described above.

The layer structure of the capacitor 24 will be described next. As shown in FIG. 4, the capacitor 24 includes the lower electrode 24A and upper electrode 24B. The lower electrode 24A is formed on the insulating substrate 2. The upper electrode 24B opposes the lower electrode 24A via part of the gate insulating film 31. In all the sub-pixels Pr, Pg, and Pb, the capacitor 24 has the same layer structures as described above.

The relationship between the layers of the transistors 21 to 23 and capacitor 24, the signal lines Y, the scan lines X, and supply lines Z will be described next with reference to FIGS. 4 to 6.

The gates 21g of the switch transistors 21, the gates 22g of the holding transistors 22, the gates 23g of the driving transistors 23, the lower electrodes 24A of the capacitors 24 of all the sub-pixels P, and all the signal line Y are formed, using photolithography and etching, by patterning a conductive film formed on the entire surface of the insulating substrate 2. The conductive film as the base of the gates 21g of the switch transistors 21, the gates 22g of the holding transistors 22, the gates 23g of the driving transistors 23, the lower electrodes 24A of the capacitors 24, and the signal lines Y will be referred to as a gate layer hereinafter.

The gate insulating film 31 is a film common to the switch transistors 21, holding transistors 22, driving transistors 23, and capacitors 24 of all the sub-pixels P and is formed on the entire surface. Hence, the gate insulating film 31 covers the gates 21g of the switch transistors 21, the gates 22g of the holding transistors 22, the gates 23g of the driving transistors 23, the lower electrodes 24A of the capacitors 24, and the signal lines Y.

The drains 21d and sources 21s of the switch transistors 21, the drains 22d and sources 22s of the holding transistors 22, the drains 23d and sources 23s of the driving transistors 23, the upper electrodes 24B of the capacitors 24 of all the sub-pixels P, and all the scan lines X and supply lines Z are formed, using photolithography and etching, by patterning a conductive film formed on the entire surface of the gate insulating film 31. The conductive film as the base of the drains 21d and sources 21s of the switch transistors 21, the drains 22d and sources 22s of the holding transistors 22, the drains 23d and sources 23s of the driving transistors 23, the upper electrodes 24B of the capacitors 24, the scan lines X, and the supply lines Z will be referred to as a drain layer hereinafter.

As shown in FIGS. 1 and 3, one contact hole 92 is formed for each 1-dot sub-pixel P in the gate insulating film 31. The gate 21g of the switch transistor 21 and the gate 22g of the holding transistor 22 are electrically connected to the scan line X through the contact hole 92. One contact hole 94 is formed for each 1-dot sub-pixel P in the gate insulating film 31. The source 21s of the switch transistor 21 is electrically connected to the signal line Y through the contact hole 94. One contact hole 93 is formed for each 1-dot sub-pixel P in the gate insulating film 31. The source 22s of the holding transistor 22 is electrically connected to the gate 23g of the driving transistor 23 and the lower electrode 24A of the capacitor 24.

As shown in FIGS. 4 to 6, the switch transistors 21, holding transistors 22, driving transistors 23 of all the sub-pixels P, and all the scan lines X and supply lines Z are covered with a protective insulating film 32 formed on the entire surface and made of silicon nitride or silicon oxide. The protective insulating film 32 is divided into rectangles at portions overlapping the supply lines Z.

A planarization film 33 having insulating properties is formed on the protective insulating film 32 so that the three-dimensional pattern of the switch transistors 21, holding transistors 22, driving transistors 23, scan lines X, and supply lines Z is eliminated by the planarization film 33. That is, the surface of the planarization film 33 is flat. The planarization film 33 is formed by hardening a photosensitive resin such as polyimide and has insulating properties. The planarization film 33 is divided into rectangles at portions overlapping the supply lines Z. The layered structure from the insulating substrate 2 to the planarization film 33 is called a transistor array substrate 50. In this embodiment, the surface layer of the transistor array substrate 50 is formed from a layered insulating film including the protective insulating film 32 and planarization film 33. The surface layer of the transistor array substrate 50 may include the protective insulating film 32 without forming the planarization film 33. The surface layer of the transistor array substrate 50 may include the planarization film 33 without forming the protective insulating film 32. Another insulating film may be formed on the protective insulating film 32 and planarization film 33.

To use the display panel 1 as a bottom emission type which outputs light emitted by the organic EL element 20 through the insulating substrate 2, i.e., to use the insulating substrate 2 as the display screen, transparent materials are used for the gate insulating film 31, protective insulating film 32, and planarization film 33.

Trenches 34 long in the horizontal direction are formed in the protective insulating film 32 and planarization film 33 at portions overlapping the supply lines Z. The protective insulating film 32 and planarization film 33 are divided into rectangles by the trenches. The feed interconnections 90 are buried in the trenches so that the feed interconnections 90 are formed along the running direction of the supply lines Z in the trenches. With this structure, the feed interconnections 90 are electrically connected to the supply lines Z. For this reason, the feed interconnections 90 are located under the sub-pixel electrodes 20a.

The feed interconnections 90 are formed by electroplating by using the supply lines Z as an undercoat and are therefore much thicker than the supply lines Z. The feed interconnections 90 preferably contain at least one of copper, aluminum, gold, and nickel.

The plurality of sub-pixel electrodes 20a are arrayed in a matrix on the surface of the planarization film 33, i.e., the upper surface of the transistor array substrate 50. The sub-pixel electrodes 20a are formed, using photolithography and etching, by patterning a transparent conductive film formed on the entire surface of the planarization film 33.

The sub-pixel electrode 20a is an electrode functioning as the anode of the organic EL element 20. More specifically, the sub-pixel electrode 20a preferably has a relatively high work function so that holes can efficiently be injected in an organic EL layer 20b (to be described later). When the display panel 1 has a bottom emission structure, the sub-pixel electrode 20a is formed from a transparent conductive film made of, e.g., indium tin oxide (ITO), indium zinc oxide, indium oxide ($In_2O_3$), tin oxide ($SnO_3$), zinc oxide (ZnO), or cadmium tin oxide (CTO).

When the display panel 1 is used as a bottom emission type, the sub-pixel electrode 20a is transparent to visible light. To use the display panel 1 as a top emission type which is designed to output light emitted by the organic EL element 20 from the opposite side to the insulating substrate 2, a reflecting film having high conductivity and high visible light reflectance is preferably formed between the sub-pixel electrode 20a and the planarization film 33. Alternatively, the sub-pixel electrode 20a itself is preferably formed as a reflecting electrode.

As shown in FIG. 6, the sub-pixel electrode 20a is patterned by etching the transparent conductive film as the base of the sub-pixel electrode 20a. A part 51 of the transparent conductive film remains even on the feed interconnection 90.

As shown in FIG. 3, three contact holes 88 are formed for each 1-dot sub-pixel P in the planarization film 33 and protective insulating film 32. The sub-pixel electrode 20a is electrically connected to the upper electrode 24B of the capacitor 24, the drain 21d of the switch transistor 21, and the source 23s of the driving transistor 23 through the contact holes 88.

As shown in FIGS. 4 to 6, a mesh-shaped insulating film 52 made of silicon nitride, silicon oxide, or any other insulating material is patterned on the surface of the planarization film 33, i.e., the surface of the transistor array substrate 50. More specifically, the insulating film 52 is patterned into a mesh shape (lattice shape) to be buried between the sub-pixel electrodes 20a. The outer periphery of the sub-pixel electrode 20a is partially covered with the insulating film 52. Most part (central portion) of the sub-pixel electrode 20a is not covered with the insulating film 52. The residual portion 51 of the transparent conductive film and the feed interconnection 90 are covered with the insulating film 52.

The common interconnection 91 is formed on the insulating film 52 between the sub-pixel electrodes 20a adjacent in the horizontal direction. Each common interconnection 91 runs in the vertical direction between the sub-pixel electrodes 20a adjacent in the horizontal direction. Each sub-pixel electrode 20a is arrayed along the common interconnections 91 between the adjacent common interconnections 91. The common interconnection 91 is formed by electroplating and therefore is much thicker than the counter electrode 20c and the source/drain electrodes and gate electrodes of the transistors 21 to 23. For this reason, the common interconnection 91 sufficiently shields light emitted from the organic EL layer 20b of the organic EL element 20. As described above, the common interconnection 91 is located above the holding transistor 22 and driving transistor 23. The common interconnection 91 covers the holding transistor 22 and driving transistor 23 via the planarization film 33 and insulating film 52. That is, when viewed from the upper side, the holding transistor 22 and driving transistor 23 are arranged inside the edge of the common interconnection 91.

A liquid repellent conductive layer 55 having water repellency/oil repellency is formed on the surface of each common interconnection 91. The liquid repellent conductive layers 55 are formed by reducing and eliminating hydrogen atoms (H) of the thiol group (—SH) of triazyl-trithiol expressed by chemical formula (1), and oxidizing and adsorbing sulfur atoms (S) in the surfaces of the common interconnections 91.

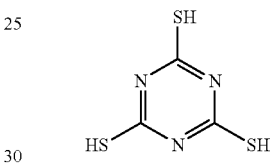

The liquid repellent conductive layer 55 is a monomolecular layer. That is, the liquid repellent conductive layer 55 is a film made of a layer of triazyl-trithiol molecules which are regularly arranged on the surface of the common interconnection 91. For this reason, the liquid repellent conductive layer 55 has a very low resistance and conductivity. To make the water repellency/oil repellency more effective, a material in which an alkyl fluoride group substitutes for one or two thiol groups of triazyl-trithiol may be used in place of triazyl-trithiol.

The organic EL layer 20b of the organic EL element 20 is formed on the sub-pixel electrode 20a. The organic EL layer 20b is a light-emitting layer of broad sense. The organic EL layer 20b contains a light-emitting material (phosphor) as an organic compound. The organic EL layer 20b has a two-layer structure in which a hole transport layer and a light-emitting layer of narrow sense are formed sequentially from the sub-pixel electrode 20a. The hole transport layer is made of PEDOT (polythiophene) as a conductive polymer and PSS (polystyrene sulfonate) as a dopant. The light-emitting layer of narrow sense is made of a polyfluorene-based light-emitting material.

In the red sub-pixel Pr, the organic EL layer 20b emits red light. In the green sub-pixel Pg, the organic EL layer 20b emits green light. In the blue sub-pixel Pb, the organic EL layer 20b emits blue light.

The organic EL layer 20b is independently provided for each sub-pixel electrode 20a. When viewed from the upper side, the plurality of organic EL layers 20b are arrayed in a matrix. Since the red sub-pixels Pr are arrayed in a line in the vertical direction, the plurality of sub-pixel electrodes 20a arrayed in a line in the vertical direction may be covered with the common organic EL layer 20b for red light emission, which has a long band shape in the vertical direction. The plurality of sub-pixel electrodes 20a arrayed adjacent in the vertical direction may be covered with the common organic EL layer 20b for green light emission, which has a long band shape in the vertical direction. The plurality of sub-pixel electrodes 20a arrayed adjacent on the opposite side in the vertical direction may be covered with the common organic EL layer 20b for blue light emission, which has a long band shape in the vertical direction.

The organic EL layer 20b is formed by wet coating (e.g., ink-jet method) after formation of the liquid repellent conductive layer 55. In this case, an organic compound-containing solution containing an organic compound as the prospective organic EL layer 20b is applied to the sub-pixel electrode 20a. The liquid level of the organic compound-containing solution at the time of application is higher than the top of the insulating film 52. The common interconnection 91 whose top is much higher than that of the insulating film 52 and the liquid level of the organic compound-containing solution is formed between the sub-pixel electrodes 20a adjacent in the horizontal direction. Hence, the organic compound-containing solution is prevented from leaking to the adjacent sub-pixel electrodes 20a over the common interconnections 91. Hence, the organic EL layers 20b can have different colors by wet coating. After that, the organic compound-containing solution dries to form the organic EL layer 20b. The top of the common interconnection 91 is higher than the surface level of the organic EL layer 20b. The common interconnection 91 is thicker than the organic EL layer 20b.

In addition, the organic compound-containing solution applied to the sub-pixel electrode 20a never becomes thick around the sub-pixel electrode 20a because of the water repellency/oil repellency of the liquid repellent conductive layer 55. Hence, the organic EL layer 20b can be formed to a uniform thickness.

The organic EL layer 20b need not always have the above-described two-layer structure. A three-layer structure including a hole transport layer, a light-emitting layer of narrow sense, and an electron transport layer formed sequentially from the sub-pixel electrode 20a may be employed. A single-layer structure including a light-emitting layer of narrow sense may be used. A layered structure having an electron or hole injection layer inserted between appropriate layers in one of the above layer structures may be employed. Any other layered structures can also be used.

The counter electrode 20c functioning as the cathode of the organic EL element 20 is formed on the organic EL layer 20b. The counter electrode 20c is a common electrode commonly formed on the entire surface for all the sub-pixels P. Since the feed interconnection 90 is covered with the insulating film 52, the feed interconnection 90 is insulated from the counter electrode 20c. On the other hand, since the common interconnection 91 is covered with the liquid repellent conductive layer 55, the common interconnection 91 is electrically connected to the counter electrode 20c.

The counter electrode 20c is preferably formed from a material having a work function lower than the sub-pixel electrode 20a, and for example, a single substance or an alloy containing at least one of magnesium, calcium, lithium, barium, indium, and a rare earth metal. The counter electrode 20c may have a layered structure in which the layers of various kinds of materials described above are stacked, or a layered structure in which a metal layer hard to oxidize is deposited in addition to the layers of various kinds of materials described above to lower the sheet resistance. In a bottom emission structure, more specifically, a layered structure including a highly pure barium layer having a low work function and provided on the interface side contacting the organic EL layer 20b, and an aluminum layer provided to cover the barium layer, or a layered structure including a lithium layer on the lower side and an aluminum layer on the upper side can be used. In a top emission structure, the counter electrode 20c may be a transparent electrode having the above-described thin film with a low work function and a transparent conductive film made of, e.g., ITO on the thin film.

A sealing insulating film 56 is formed on the counter electrode 20c to cover the entire counter electrode 20c. The sealing insulating film 56 is an inorganic or organic film provided to prevent any degradation of the counter electrode 20c.

Conventionally, in an EL display panel having a top emission structure, at least part of the counter electrode corresponding to the counter electrode 20c is formed as a transparent electrode of, e.g., a metal oxide having a high resistance value. Such a material can sufficiently reduce the sheet resistance only by increasing the thickness. When the material is thick, the optical transmittance decreases inevitably. Conversely, when the counter electrode is made thin, as the screen size becomes large, a uniform potential can hardly be obtained in a plane, and the display characteristic becomes poor.

In this embodiment, however, the plurality of common interconnections 91 with a low resistance are provided to obtain a sufficient thickness. Hence, the sheet resistance value of the entire cathode electrodes of the plurality of organic EL elements 20 can be decreased together with the counter electrode 20c so that a sufficiently large current can be supplied uniformly in a plane. In this structure, the common interconnections 91 reduce the sheet resistance of the cathode electrode. For this reason, the transmittance can be increased by forming the counter electrode 20c thin.

The feed interconnections 90 are formed from a thick conductive layer except the conductive layer as the base of the electrodes of the thin-film transistors 21 to 23 and electrically connected to the supply lines Z. For this reason, the delay until the write current or driving current (to be described later) in the plurality of organic EL elements 20 reaches a predetermined magnitude, which is caused by the voltage drop in the supply lines Z formed by only the conductive layer as the base of the thin-film transistors 21 to 23, can be prevented, and the elements can satisfactorily be driven.

[Display Panel Driving Method]

FIG. 7 shows a structure to drive the display panel 1. A select driver 111 connected to the scan lines $X_1$ to $X_m$ is arranged in the first peripheral portion of the insulating substrate 2. A feed driver 112 connected to the feed interconnections 90 (supply lines $Z_1$ to $Z_m$) electrically insulated from each other is arranged in the second peripheral portion of the insulating substrate 2 opposing the first peripheral portion.

Figure 8:
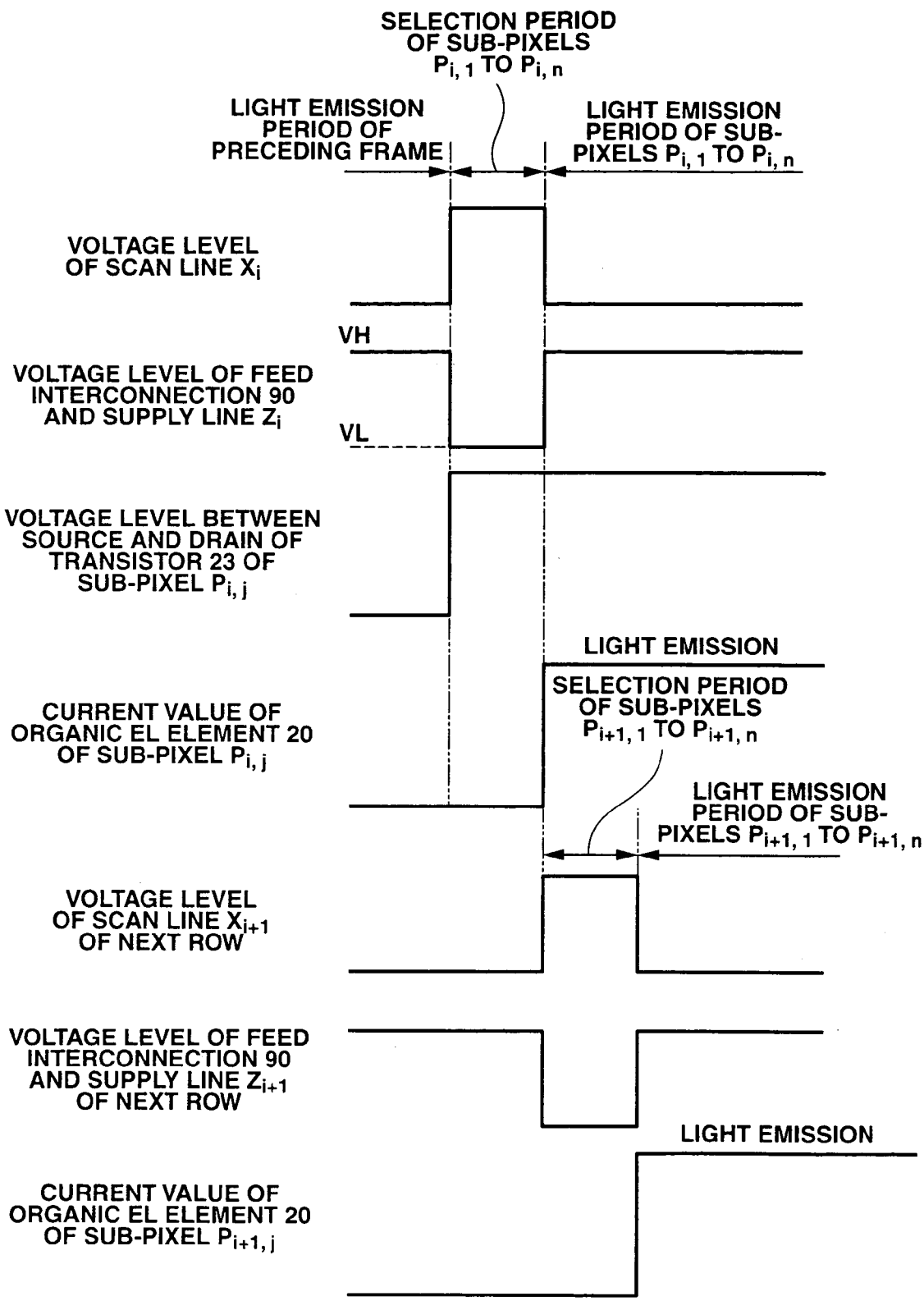
FIG. 8 is a timing chart for explaining a driving method of the display panel 1 shown in FIG. 7.

The display panel 1 can be driven by the active matrix method in the following way. As shown in FIG. 8, the select driver 111 connected to the scan lines $X_1$ to $X_m$ sequentially outputs a shift pulse of high level to the scan lines $X_1$ to $X_m$ in this order (the scan line $X_1$ next to the scan line $X_m$), thereby sequentially selecting the scan lines $X_1$ to $X_m$. The feed driver 112 is connected to the feed interconnections 90. The feed driver 112 applies a write feed voltage VL to supply a write current to the driving transistors 23 connected to the supply lines $Z_1$ to $Z_m$ through the feed interconnections 90 in a selection period. The feed driver 112 applies a driving feed voltage VH to supply a driving current to the organic EL elements 20 through the driving transistors 23 in a light emission period. The feed driver 112 sequentially outputs the write feed voltage VL of low level (lower than the voltage of the counter electrode of the organic EL elements 20) to the supply lines $Z_1$ to $Z_m$ in this order (the supply line $Z_1$ next to the supply line $Z_m$) in synchronism with the select driver, thereby sequentially selecting the supply lines $Z_1$ to $Z_m$. While the select driver 111 is selecting the scan lines $X_1$ to $X_m$, a data driver supplies a write current (current signal) serving as a pull-out current to all the signal lines $Y_1$ to $Y_n$ through the drain-to-source paths of the driving transistors 23 of a predetermined row. The counter electrode 20c and common interconnections 91 are connected to an external device through a lead interconnection 95 and interconnection terminals Tc and held at a predetermined common potential Vcom (e.g., ground=0V).

In each selection period, the potential on the data driver side is equal to or lower than the write feed voltage VL output to the feed interconnections 90 and the supply lines $Z_1$ to $Z_m$. The write feed voltage VL is set to be equal to or lower than the common potential Vcom. At this time, no current flows from the organic EL elements 20 to the signal lines $Y_1$ to $Y_n$. As shown in FIG. 2, a write current (pull-out current) having a current value corresponding to the gray level is supplied from the data driver to the signal lines $Y_1$ to $Y_n$, as indicated by an arrow A. In the sub-pixel $P_{i,j}$, the write current (pull-out current) to the signal line $Y_j$ flows from the feed interconnection 90 and supply line $Z_i$ through the drain-to-source path of the driving transistor 23 and the drain-to-source path of the switch transistor 21. The current value of the current flowing through the drain-to-source path of the driving transistor 23 is uniquely controlled by the data driver. The data driver sets the current value of the write current (pull-out current) in accordance with an externally input gray level. While the write current (pull-out current) is flowing, the voltage between the gate 23g and source 23s of the driving transistor 23 of each of sub-pixels $P_{i,1}$ to $P_{i,n}$ of the ith row is forcibly set in accordance with the current value of the write current (pull-out current) flowing to the signal lines $Y_1$ to $Y_n$, i.e., the current value of the write current (pull-out current) flowing between the drain 23d and source 23s of the driving transistor 23 independently of the change over time in the Vg-Ids characteristic of the driving transistor 23. Charges with a magnitude corresponding to the level of this voltage are stored in the capacitor 24 so that the current value of the write current (pull-out current) is converted into the voltage level between the gate 23g and source 23s of the driving transistor 23. In the subsequent light emission period, the scan line $X_i$ changes to low level so that the switch transistor 21 and holding transistor 22 are turned off. The charges on the side of the electrode 24A of the capacitor 24 are confined by the holding transistor 22 in the OFF state, and a floating state is set. Hence, even when the voltage of the source 23s of the driving transistor 23 is modulated at the time of transition from the selection period to the light emission period, the potential difference between the gate 23g and source 23s of the driving transistor 23 is maintained. In the light emission period, the potential of the supply line $Z_i$ and the feed interconnection 90 connected to it equals the driving feed voltage VH which is higher than the potential Vcom of the counter electrode 20c of the organic EL element 20. Hence, a driving current flows from the supply line $Z_i$ and the feed interconnection 90 connected to it to the organic EL element 20 in the direction of arrow B through the driving transistor 23. Hence, the organic EL element 20 emits light. The current value of the driving current depends on the voltage between the gate 23g and source 23s of the driving transistor 23. For this reason, the current value of the driving current in the light emission period equals the current value of the write current (pull-out current) in the selection period.

FIG. 9 shows a structure to drive the display panel 1 by another driving method. As shown in FIG. 9, the select driver 111 connected to the scan lines $X_1$ to $X_m$ is arranged in the first peripheral portion of the insulating substrate 2. A lead interconnection 109 which is integrated with the feed interconnections 90 to electrically connect them to each other is arranged in the second peripheral portion of the insulating substrate 2 opposing the first peripheral portion. The lead interconnection 109 receives a clock signal from both terminal portions 109a and 109b located in the third and fourth peripheral portions perpendicular to the first and second peripheral portions, respectively.

Figure 10:
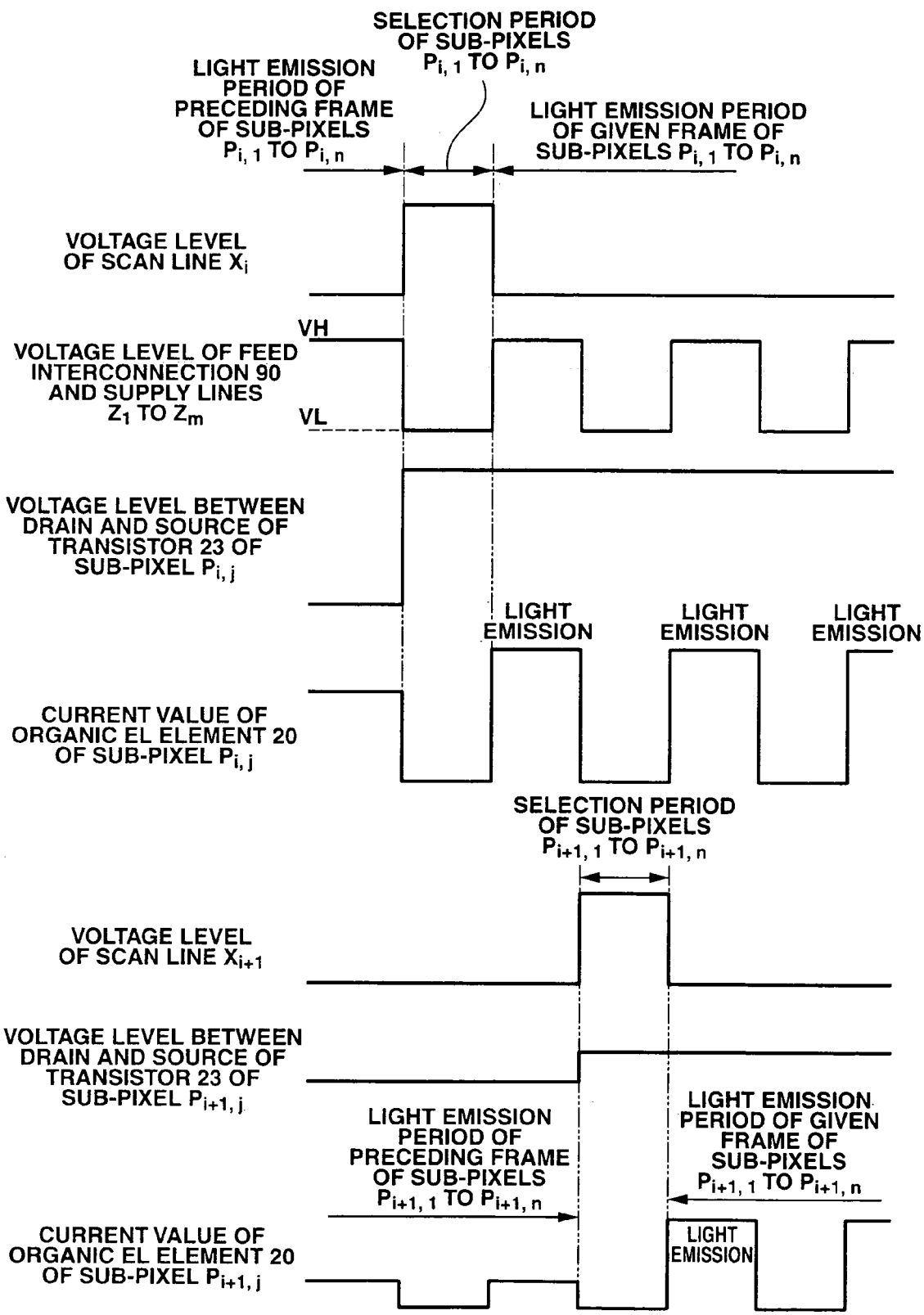
FIG. 10 is a timing chart for explaining a driving method of the display panel 1 shown in FIG. 9.

Another active matrix driving method of the display panel 1 will be described next. As shown in FIG. 10, an external oscillation circuit outputs a clock signal from the terminal portions 109a and 109b to the feed interconnections 90 and supply lines $Z_1$ to $Z_m$ through the lead interconnection 109. The select driver 111 sequentially outputs a shift pulse of high level to the scan lines $X_1$ to $X_m$ in this order (the scan line $X_1$ next to the scan line $X_m$), thereby sequentially selecting the scan lines $X_1$ to $X_m$. While the select driver 111 is outputting the shift pulse of high level, i.e., ON level to one of the scan lines $X_1$ to $X_m$, the clock signal from the oscillation circuit changes to low level. When the select driver 111 selects the scan lines $X_1$ to $X_m$, the data driver supplies a pull-out current (current signal) as the write current to all the signal lines $Y_1$ to $Y_n$ through the drain-to-source paths of the driving transistors 23. The counter electrode 20c and feed interconnections 90 are held at the predetermined common potential Vcom (e.g., ground=0V).

In the selection period of the scan line $X_i$, the shift pulse is output to the scan line $X_i$ of the ith row so that the switch transistor 21 and holding transistor 22 are turned on. In each selection period, the potential on the data driver side is equal to or lower than the clock signal output to the feed interconnections 90 and supply lines $Z_1$ to $Z_m$. The low level of the clock signal is set to be equal to or lower than the common potential Vcom. At this time, no current flows from the organic EL elements 20 to the signal lines $Y_1$ to $Y_n$. As shown in FIG. 2, a write current (pull-out current) having a current value corresponding to the gray level is supplied from the data driver to the signal lines $Y_1$ to $Y_n$, as indicated by the arrow A. In the sub-pixel $P_{i,j}$, the write current (pull-out current) to the signal line $Y_j$ flows from the feed interconnection 90 and supply line $Z_i$ through the drain-to-source path of the driving transistor 23 and the drain-to-source path of the switch transistor 21. The current value of the current flowing through the drain-to-source path of the driving transistor 23 is uniquely controlled by the data driver. The data driver sets the current value of the write current (pull-out current) in accordance with an externally input gray level. While the write current (pull-out current) is flowing, the voltage between the gate 23g and source 23s of the driving transistor 23 of each of the sub-pixels $P_{i,1}$ to $P_{i,n}$ of the ith row is forcibly set in accordance with the current value of the write current (pull-out current) flowing to the signal lines $Y_1$ to $Y_n$, i.e., the current value of the write current (pull-out current) flowing between the drain 23d and source 23s of the driving transistor 23 independently of the change over time in the Vg-Ids characteristic of the driving transistor 23. Charges with a magnitude corresponding to the level of this voltage are stored in the capacitor 24 so that the current value of the write current (pull-out current) is converted into the voltage level between the gate 23g and source 23s of the driving transistor 23. In the subsequent light emission period, the scan line $X_i$ changes to low level so that the switch transistor 21 and holding transistor 22 are turned off. The charges on the side of the electrode 24A of the capacitor 24 are confined by the holding transistor 22 in the OFF state, and a floating state is set. Hence, even when the voltage of the source 23s of the driving transistor 23 is modulated at the time of transition from the selection period to the light emission period, the potential difference between the gate 23g and source 23s of the driving transistor 23 is maintained. Of the selection period, in a period in which no row is selected, i.e., the clock signal is at high level, and the potential of the feed interconnection 90 and supply line $Z_i$ is higher than the potential Vcom of the counter electrode 20c of the organic EL element 20 and the feed interconnection 90, the driving current flows from the feed interconnection 90 and supply line $Z_i$ with a higher potential to the organic EL element 20 through the drain-to-source path of the driving transistor 23 in the direction of arrow B. Hence, the organic EL element emits light. The current value of the driving current depends on the voltage between the gate 23g and source 23s of the driving transistor 23. For this reason, the current value of the driving current in the light emission period equals the current value of the write current (pull-out current) in the selection period. Of the selection period, in a period in which any row is selected, i.e., the clock signal is at low level, the potential of the feed interconnection 90 and supply line $Z_i$ is equal to or lower than the potential Vcom of the counter electrode 20c and feed interconnection 90. Hence, no driving current flows to the organic EL element 20, and no light emission occurs.

In either driving method, the switch transistor 21 functions to turn on (selection period) and off (light emission period) of the current between the signal line $Y_j$ and the source 23s of the driving transistor 23. The holding transistor 22 functions to make it possible to supply the current between the source 23s and drain 23d of the driving transistor 23 in the selection period and hold the voltage applied between the gate 23g and source 23s of the driving transistor 23 in the light emission period. When the supply lines Z and the feed interconnections 90 are at high level in the light emission period, the driving transistor 23 functions to drive the organic EL element 20 by supplying a current having a magnitude corresponding to the gray level to the organic EL element 20.

As described above, the magnitude of the current flowing to the feed interconnection 90 equals the sum of the magnitudes of driving currents flowing to the n organic EL elements 20 connected to the supply lines $Z_i$ of one column. When a selection period to do moving image driving using pixels for VGA or more is set, the parasitic capacitance of each feed interconnection 90 increases. The resistance of an interconnection formed from a thin film which forms the gate electrode or the source/drain electrode of a thin-film transistor is so high that the write current cannot be supplied to the n organic EL elements 20 connected to the supply lines Z of one row. In this embodiment, the feed interconnections 90 are connected to the supply lines Z by a conductive layer different from the gate electrodes or the source/drain electrodes of thin-film transistors of the sub-pixels $P_{1,1}$ to $P_{m,n}$. For this reason, the voltage drop by the feed interconnections 90 is small. Even in a short selection period, the write current can sufficiently be supplied without any delay. Since the resistance of the feed interconnection 90 is lowered by thickening it, the feed interconnection 90 can be made narrow. Since the feed interconnection 90 overlaps the supply line Z, in a bottom emission structure, the decrease in pixel opening ratio can be minimized.

Similarly, the magnitude of the current flowing to the common interconnection 91 in the light emission period equals that of the write current flowing to the feed interconnection 90 in the selection period. Since the common interconnections 91 use a conductive layer different from the gate electrodes or the source/drain electrodes of thin-film transistors of the sub-pixels $P_{1,1}$ to $P_{m,n}$, the common interconnection 91 can be made sufficiently thick, and its resistance can be lowered. In addition, even when the counter electrode 20c itself becomes thin and increases its resistance, the voltage of the counter electrode 20c can be uniformed in a plane. Hence, even if the same potential is applied to all the sub-pixel electrodes 20a, the light emission intensities of the organic EL layers 20b almost equal, and the light emission intensity in a plane can be uniformed. When the display panel 1 is used as a top emission type, the counter electrode 20c can be made thinner. Hence, light emitted from the organic EL layer 20b hardly attenuates while passing through the counter electrode 20c. Additionally, since the common interconnections 91 are provided between the sub-pixel electrodes 20a adjacent in the horizontal direction when viewed from the upper side, the decrease in pixel opening ratio can be minimized.

The driving transistor 23 and holding transistor 22 have the light-shielding effect. However, since the driving transistor 23 and holding transistor 22 overlap the light-shielding common interconnection 91 when viewed from the upper side, the decrease in pixel opening ratio can be minimized.

The common interconnection 91 of the kth column ($2 \leq k \leq n+1$) laterally covers the transistors 22 and 23 of the sub-pixels P of the (k−1)th column. That is, the organic EL layer 20b does not overlap the drain-to-source paths of the transistors 22 and 23 when viewed from the upper side. For this reason, light from the organic EL layer 20b hardly enters from the drain-to-source paths of the transistors 22 and 23 to the semiconductor films 22c and 23c of the transistors 22 and 23. Hence, modulation of the transistors by light incidence in the semiconductor films 22c and 23c can be suppressed. Especially, the driving transistor 23 which supplies the driving current to the organic EL element 20 may be impeded in accurate luminance gray level by light incidence. Hence, with the structure of this embodiment, accurate luminance gray level can be expressed.

[Widths, Sectional Areas, and Resistivities of Feed Interconnection and Common Interconnection]

Figure 11:
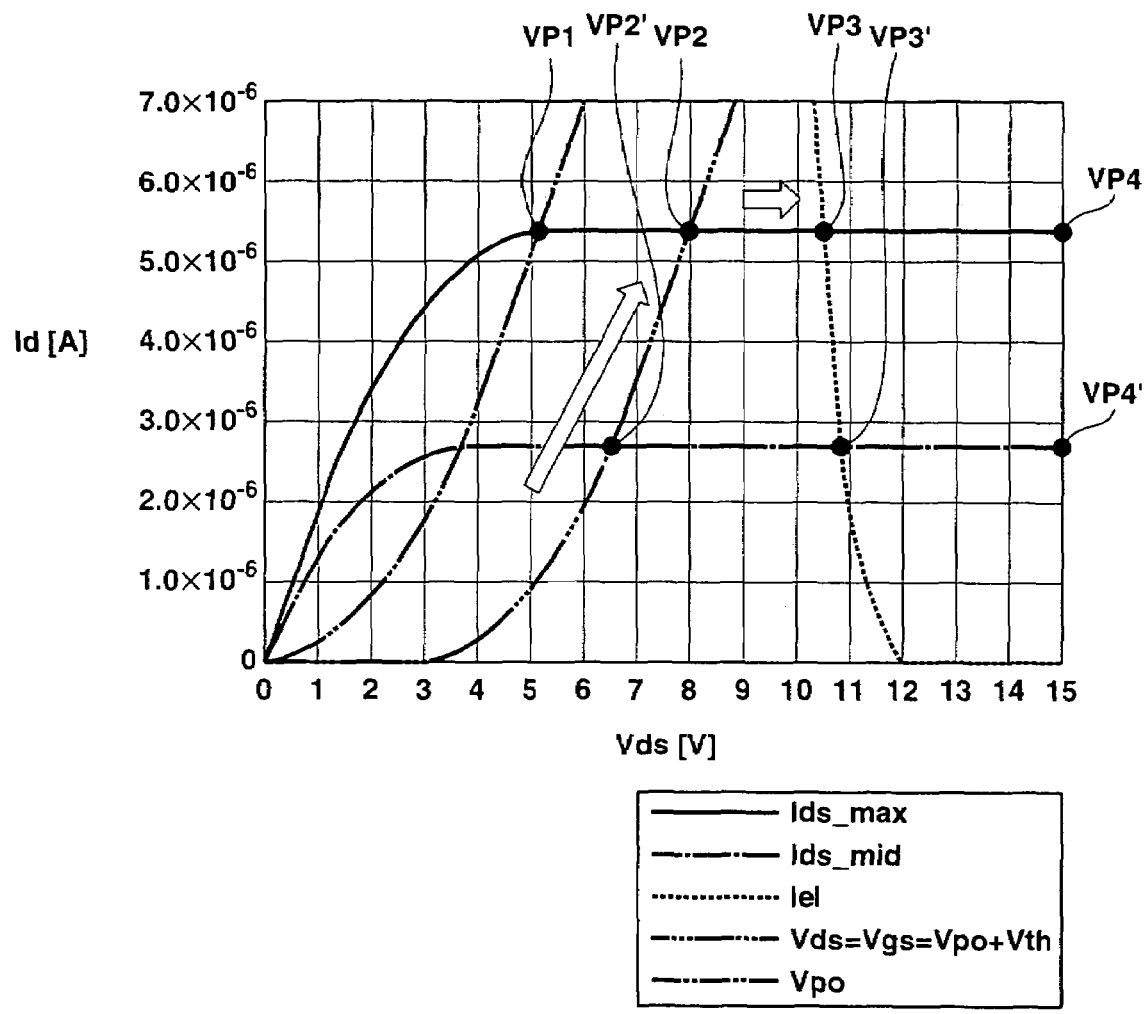
FIG. 11 is a graph showing the current vs. voltage characteristic of a driving transistor 23 and organic EL element 20 of each sub-pixel.

The widths, sectional areas, and resistivities of the feed interconnection 90 and common interconnection 91 of the display panel 1 will be defined. When the display panel 1 has sub-pixels corresponding to WXGA (768×1366), the desired width and sectional area of the feed interconnection 90 and common interconnection 91 are defined. FIG. 11 is a graph showing the current vs. voltage characteristic of the driving transistor 23 and organic EL element 20 of each sub-pixel.

Referring to FIG. 11, the ordinate represents the magnitude of the write current flowing between the source 23s and drain 23d of one driving transistor 23 or the magnitude of the driving current flowing between the anode and cathode of one organic EL element 20. The abscissa represents the level of the voltage between the drain 23d and source 23s of one driving transistor 23 (also the voltage between the gate 23g and drain 23d of one driving transistor 23). Referring to FIG. 11, a solid line Ids max indicates a write current and driving current for the highest luminance gray level (brightest display). An alternate long and short dashed line Ids mid indicates a write current and driving current for an intermediate highest luminance gray level between the highest luminance gray level and the lowest luminance gray level. An alternate long and two short dashed line Vpo indicates a threshold value between the unsaturation region (linear region) and the saturation region of the driving transistor 23, i.e., the pinch-off voltage. An alternate long and three short dashed line Vds indicates a write current flowing between the source 23s and drain 23d of the driving transistor 23. A broken line Iel indicates a driving current flowing between the anode and cathode of the organic EL element 20.

A voltage VP1 is the pinch-off voltage of the driving transistor 23 for the highest luminance gray level. A voltage VP2 is the drain-to-source voltage of the driving transistor 23 when a write current for the highest luminance gray level flows. A voltage VELmax (voltage VP4−voltage VP3) is the anode-to-cathode voltage when the organic EL element 20 emits light by a driving current of the highest luminance gray level, which has a magnitude equal to that of the write current for the highest luminance gray level. A voltage VP2' is the drain-to-source voltage of the driving transistor 23 when a write current for the intermediate luminance gray level flows. A voltage (voltage VP4'−voltage VP3') is the anode-to-cathode voltage when the organic EL element 20 emits light by a driving current of the intermediate luminance gray level, which has a magnitude equal to that of the write current for the intermediate luminance gray level.

To drive the driving transistor 23 and organic EL element 20 in the saturation region, a value VX obtained by subtracting (the voltage Vcom of the common interconnection 91 in the light emission period) from (the driving feed voltage VH of the feed interconnection 90 in the light emission period) satisfies $$VX = Vpo + Vth + Vm + VEL \quad (1)$$

where Vth (=VP2−VP1 for the highest luminance) is the threshold voltage of the driving transistor 23, VEL (=VEmax for the highest luminance) is the anode-to-cathode voltage of the organic EL element 20, and Vm is an allowable voltage which displaces in accordance with the gray level.

As is apparent from FIG. 11, of the voltage VX, the higher the luminance gray level is, the higher the voltage (Vpo+Vth) necessary between the drain and source of the transistor 23 is, and also, the higher the voltage VEL necessary between the anode and cathode of the organic EL element 20 is. Hence, the allowable voltage Vm becomes low as the luminance gray level becomes high. A minimum allowable voltage Vmmin is VP3−VP2.

The organic EL element 20 generally degrades and increases its resistance over time no matter whether a low or high molecular weight EL material. It has been confirmed that the anode-to-cathode voltage after 10,000 hrs is about 1.4 times that in the initial state. That is, the voltage VEL rises along with the elapse of time even when the luminance gray level does not change. The operation is stable for a long time when the allowable voltage Vm in the initial driving state is as high as possible. Hence, the voltage VX is set such that the voltage VEL becomes 8V or more and, more preferably, 13V or more.

The allowable voltage Vm includes not only the increase amount of the resistance of the organic EL element 20 but also the voltage drop by the feed interconnection 90.

If the voltage drop is large because of the interconnection resistance of the feed interconnection 90, the power consumption of the EL display panel 1 considerably increases. Hence, the voltage drop of the feed interconnection 90 is especially preferably set to 1V or less.

A sub-pixel width Wp as the row-direction length of one sub-pixel P and the number of sub-pixels (1366) in the row direction are taken into consideration. In this case, the total length of the feed interconnection 90 is 706.7 mm for the display panel 1 with a panel size of 32 inches or 895.2 mm for 40 inches. If a line width WL of the feed interconnection 90 and common interconnection 91 is large, the area of the organic EL layer 20b decreases structurally. In addition, the overlap parasitic capacitance to other interconnections is also generated, and the voltage drop becomes larger. To prevent this, the line width WL of the feed interconnection 90 and common interconnection 91 is preferably suppressed to ⅕ or less the sub-pixel width Wp. In consideration of this, the line width WL is 34 μm or less for the display panel 1 with a panel size of 32 inches or 44 μm or less for 40 inches. A maximum thickness Hmax of the feed interconnection 90 and common interconnection 91 is 1.5 times the minimum process size (4 μm) of the transistors 21 to 23, i.e., 6 μm when the aspect ratio is taken into consideration. A maximum sectional area Smax of the feed interconnection 90 and common interconnection 91 is 204 μm² for 32 inches or 264 μm² for 40 inches.

Figure 12:
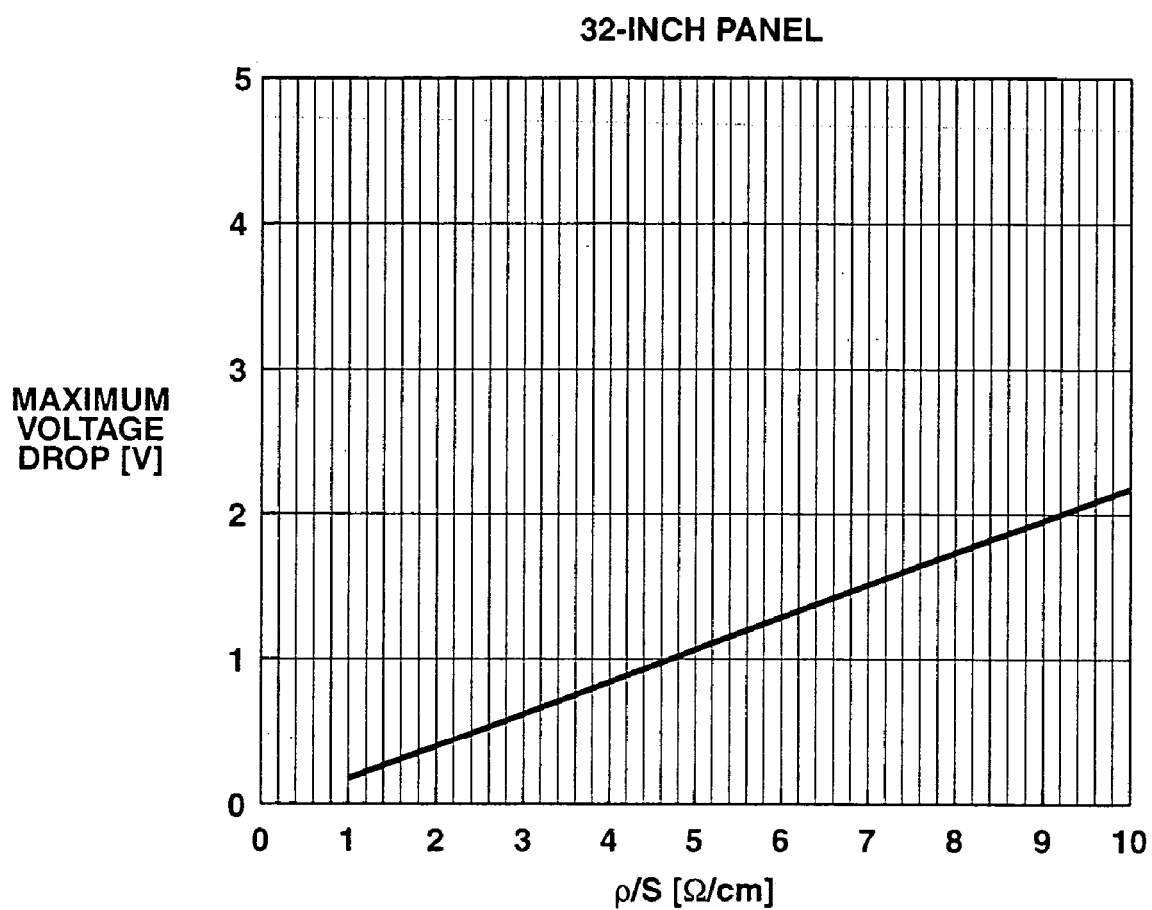
FIG. 12 is a graph showing the correlation between the maximum voltage drop and an interconnection resistivity $\rho$/sectional area S of a feed interconnection 90 and common interconnection 91 of a 32-inch display panel 1.
Figure 13:
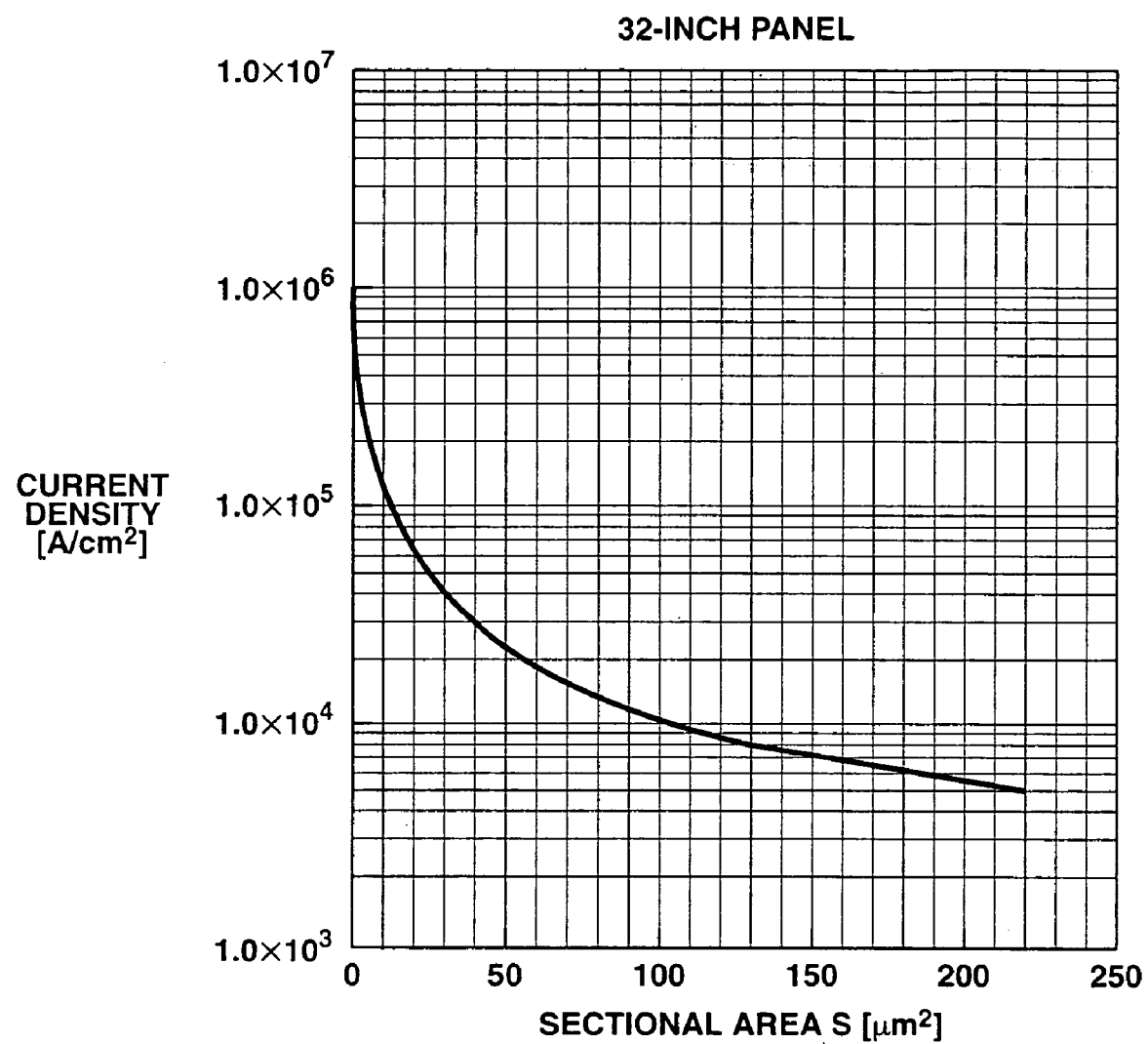
FIG. 13 is a graph showing the correlation between the sectional area and the current density of the feed interconnection 90 and common interconnection 91 of the 32-inch display panel 1.

To make the maximum voltage drop of the feed interconnection 90 and common interconnection 91 1V or less when the 32-inch display panel 1 is fully lighted to flow the maximum current, an interconnection resistivity ρ/sectional area S of the feed interconnection 90 and common interconnection 91 must be set to 4.7 Ω/cm or less, as shown in FIG. 12. FIG. 13 shows the correlation between the sectional area and the current density of the feed interconnection and common interconnection of the 32-inch display panel 1. The resistivity allowed when the above-described feed interconnection 90 and common interconnection 91 have the maximum sectional area Smax is 9.6 μΩcm for 32 inches or 6.4 μΩcm for 40 inches.

Figure 14:
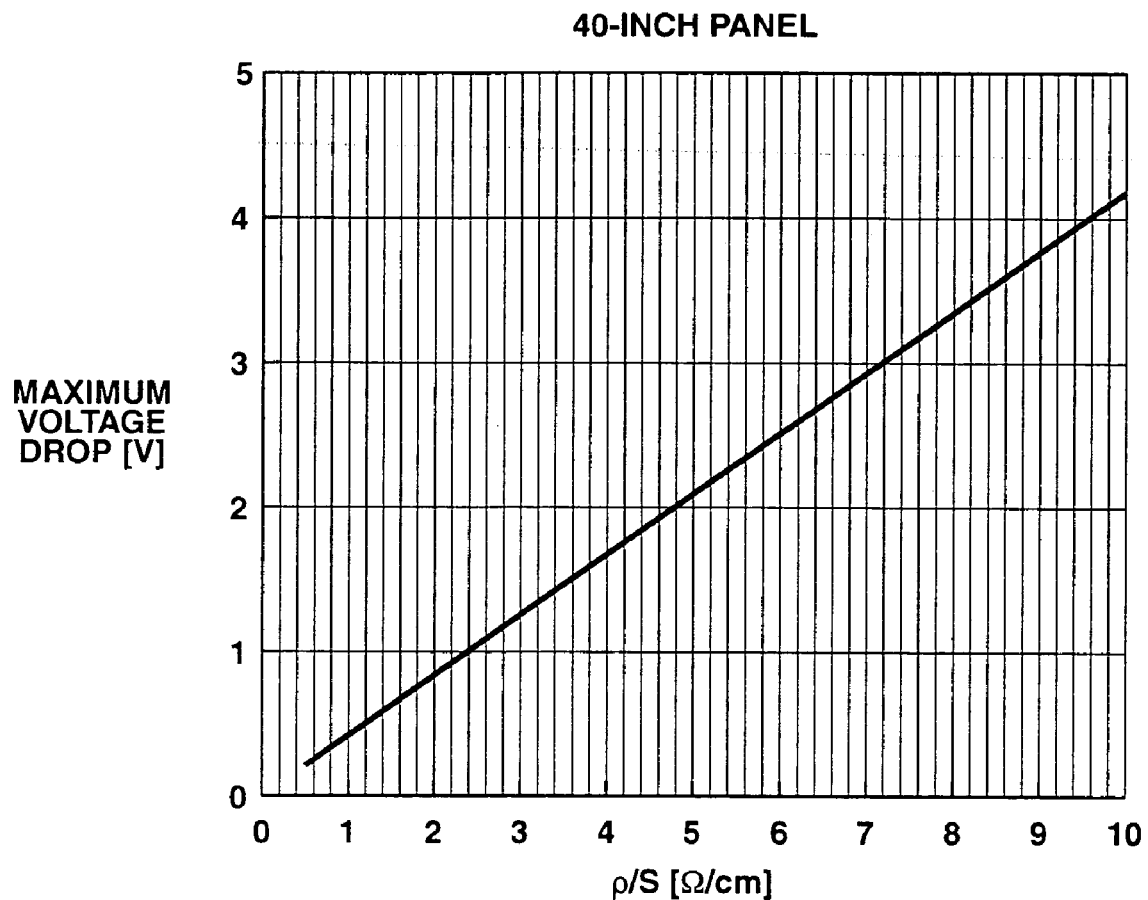
FIG. 14 is a graph showing the correlation between the maximum voltage drop and the interconnection resistivity $\rho$/sectional area S of the feed interconnection 90 and common interconnection 91 of a 40-inch display panel 1.
Figure 15:
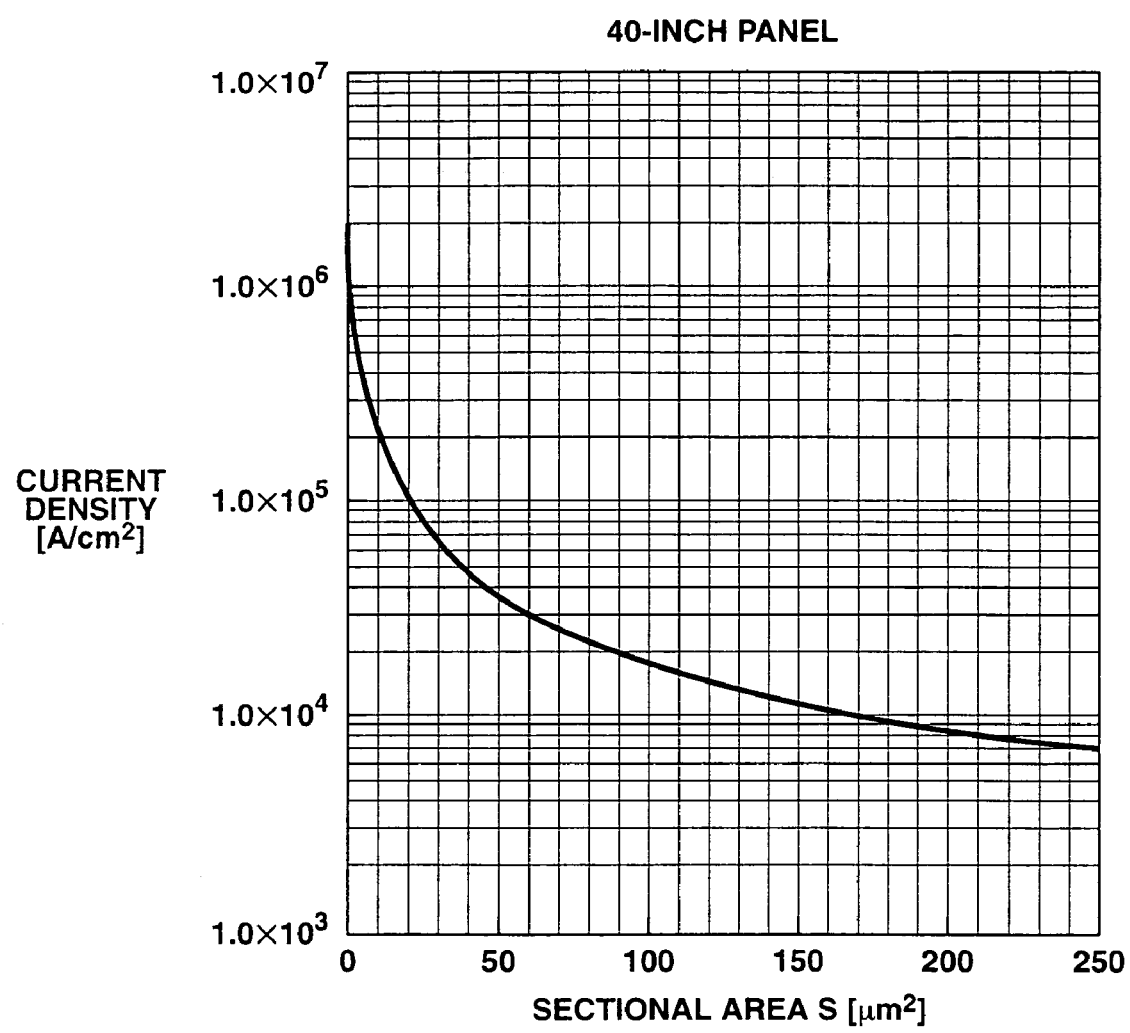
FIG. 15 is a graph showing the correlation between the sectional area and the current density of the feed interconnection 90 and common interconnection 91 of the 40-inch display panel 1.

To make the maximum voltage drop of the feed interconnection 90 and common interconnection 91 1V or less when the 40-inch display panel 1 is fully lighted to flow the maximum current, the interconnection resistivity ρ/sectional area S of the feed interconnection 90 and common interconnection 91 must be set to 2.4 Ω/cm or less, as shown in FIG. 14. FIG. 15 shows the correlation between the sectional area and the current density of the feed interconnection 90 and common interconnection 91 of the 40-inch display panel 1.

A median time to failure MTF at which the EL display panel stops operation due to a failure in the feed interconnection 90 and common interconnection 91 satisfies $$MTF = A\exp(Ea/K_b T)/\rho J^2 \quad (2)$$

where Ea is an activation energy, $K_b T = 8.617 \times 10^{-5}$ eV, ρ is the resistivity of the feed interconnection 90 and common interconnection 91, and J is a current density.

The median time to failure MTF of the feed interconnection 90 and common interconnection 91 is determined by an increase in resistivity or electromigration. When the feed interconnection 90 and common interconnection 91 are set to an Al-based material (Al single substance or an alloy such as AlTi or AlNd), and calculation is done on trial for MTF of 10,000 hrs and an operation temperature of 85° C., the current density J must be $2.1 \times 10^4$ A/cm² or less. When the feed interconnection 90 and common interconnection 91 are set to Cu, the current density J must be $2.8 \times 10^6$ A/cm² or less. It is assumed that materials except Al in an Al alloy have a resistivity lower than Al.

In consideration of these, in the 32-inch display panel 1, the sectional area S of the Al-based feed interconnection 90 and common interconnection 91 must be 57 μm² or more to prevent any failure in them in the full lighting state for 10,000 hrs, as shown in FIG. 12. The sectional area S of the feed interconnection 90 and common interconnection 91 made of Cu must be 0.43 μm² or more, as shown in FIG. 13.

In the 40-inch display panel 1, the sectional area S of the Al-based feed interconnection 90 and common interconnection 91 must be 92 μm² or more to prevent any failure in them in the full lighting state for 10,000 hrs, as shown in FIG. 14.

The sectional area S of the feed interconnection 90 and common interconnection 91 made of Cu must be 0.69 μm² or more, as shown in FIG. 15.

In the 32-inch display panel 1, the interconnection resistivity ρ/sectional area S of the Al-based feed interconnection 90 and common interconnection 91 is 4.7 Ω/cm or less, as described above, assuming that the resistivity of the Al-based material is 4.00 μΩcm. Hence, a minimum sectional area 5 min is 85.1 μm². Since the line width WL of the feed interconnection 90 and common interconnection 91 is 34 μm or less, as described above, a minimum thickness Hmin of the feed interconnection 90 and common interconnection 91 is 2.50 μm.

In the 40-inch display panel 1, the interconnection resistivity ρ/sectional area S of the Al-based feed interconnection 90 and common interconnection 91 is 2.4 Ω/cm or less, as described above. Hence, the minimum sectional area Smin is 167 μm². Since the line width WL of the feed interconnection 90 and common interconnection 91 is 44 μm or less, as described above, the minimum thickness Hmin of the feed interconnection 90 and common interconnection 91 is 3.80 μm.

In the 32-inch display panel 1, the interconnection resistivity ρ/sectional area S of the feed interconnection 90 and common interconnection 91 made of Cu is 4.7 Ω/cm or less, as described above, assuming that the resistivity of Cu is 2.10 μΩcm. Hence, the minimum sectional area Smin is 44.7 μm². Since the line width WL of the feed interconnection 90 and common interconnection 91 is 34 μm or less, as described above, the minimum thickness Hmin of the feed interconnection 90 and common interconnection 91 is 1.31 μm.

In the 40-inch display panel 1, the interconnection resistivity ρ/sectional area S of the feed interconnection 90 and common interconnection 91 made of Cu is 2.4 Ω/cm or less, as described above. Hence, the minimum sectional area Smin is 87.5 μm². Since the line width WL of the feed interconnection 90 and common interconnection 91 is 44 μm or less, as described above, the minimum thickness Hmin of the feed interconnection 90 and common interconnection 91 is 1.99 μm.

Hence, to cause the display panel 1 to operate normally at a low power consumption, the voltage drop in the feed interconnection 90 and common interconnection 91 is preferably set to 1V or less. To set such a condition, in a 32-inch panel in which the feed interconnection 90 and common interconnection 91 are made of an Al-based material, a thickness H is 2.50 to 6 μm, the width WL is 14.1 to 34.0 μm, and the resistivity is 4.0 to 9.6 μΩcm. In a 40-inch panel in which the feed interconnection 90 and common interconnection 91 are made of an Al-based material, the thickness H is 3.80 to 6 μm, the width WL is 27.8 to 44.0 μm, and the resistivity is 4.0 to 9.6 μΩcm.

In general, for the Al-based feed interconnection 90 and common interconnection 91, the thickness H is 2.50 to 6 μm, the width WL is 14.1 to 44.0 μm, and the resistivity is 4.0 to 9.6 μΩcm.

In a 32-inch panel in which the feed interconnection 90 and common interconnection 91 are made of Cu, the thickness H is 1.31 to 6 μm, the width WL is 7.45 to 34.0 μm, and the resistivity is 2.1 to 9.6 μΩcm. In a 40-inch panel in which the feed interconnection 90 and common interconnection 91 are made of Cu, the thickness H is 1.99 to 6 μm, the width WL is 14.6 to 44.0 μm, and the resistivity is 2.1 to 9.6 μΩcm.

In general, for the feed interconnection 90 and common interconnection 91 made of Cu, the thickness H is 1.31 to 6 μm, the width WL is 7.45 to 44.0 μm, and the resistivity is 2.1 to 9.6 μΩcm.

Hence, when an Al-based material or Cu is used for the feed interconnection 90 and common interconnection 91, the feed interconnection 90 and common interconnection 91 of the EL display panel 1 have the thickness H of 1.31 to 6 μm, the width WL of 7.45 to 44.0 μm, and the resistivity of 2.1 to 9.6 μΩcm.

As described above, the common interconnections 91 provided on the surface of the counter electrode 20c are formed from a layer different from the electrodes of the transistors 21 to 23. Hence, the common interconnections 91 can be made thick and have a low resistance. The common interconnections 91 having a low resistance are electrically connected to the counter electrode 20c. For this reason, even when the counter electrode 20c itself becomes thin and increases its resistance, the voltage of the counter electrode 20c can be uniformed in a plane. Hence, even if the same potential is applied to all the sub-pixel electrodes 20a, the light emission intensities of the organic EL layers 20b almost equal, and the light emission intensity in a plane can be uniformed.

When the display panel 1 is used as a top emission type, the counter electrode 20c can be made thinner. Hence, light emitted from the organic EL layer 20b hardly attenuates while passing through the counter electrode 20c. Additionally, since the common interconnections 91 are provided between the sub-pixel electrodes 20a adjacent in the vertical direction when viewed from the upper side, the decrease in pixel opening ratio can be minimized.

The feed interconnections 90 buried in the trenches in the planarization film 33 and protective insulating film 32 are formed from a layer different from the electrodes of the transistors 21 to 23. Hence, the feed interconnections 90 can be made thick and have a low resistance. The feed interconnections 90 having a low resistance are formed on the thin supply lines Z. For this reason, the voltage drop in the supply lines Z can be suppressed, and the signal delay in the supply lines Z and feed interconnections 90 can be suppressed. For example, when the size of the display panel 1 is increased without the feed interconnections 90, the light emission intensity in a plane may vary due to the voltage drop in the supply lines Z, or some organic EL elements 20 cannot emit light. In this embodiment, however, since the feed interconnections 90 having a low resistance are electrically connected to the supply lines Z, the light emission intensity in a plane can be prevented from varying, and the organic EL elements 20 which cannot emit light can be eliminated.

Since the feed interconnections 90 are made thick to decrease the resistance, the feed interconnections 90 can be made narrow. In addition, since the narrow feed interconnections 90 are provided between the sub-pixel electrodes 20a adjacent in the vertical direction when viewed from the upper side, the decrease in pixel opening ratio can be minimized.

Since the liquid repellent conductive layer 55 is formed on the surface of each common interconnection 91, the organic EL layers 20b can have different colors by wet coating.

[First Modification]

The present invention is not limited to the above-described embodiment, and various changes and modifications can be made without departing from the spirit and scope of the present invention.

Figure 16:
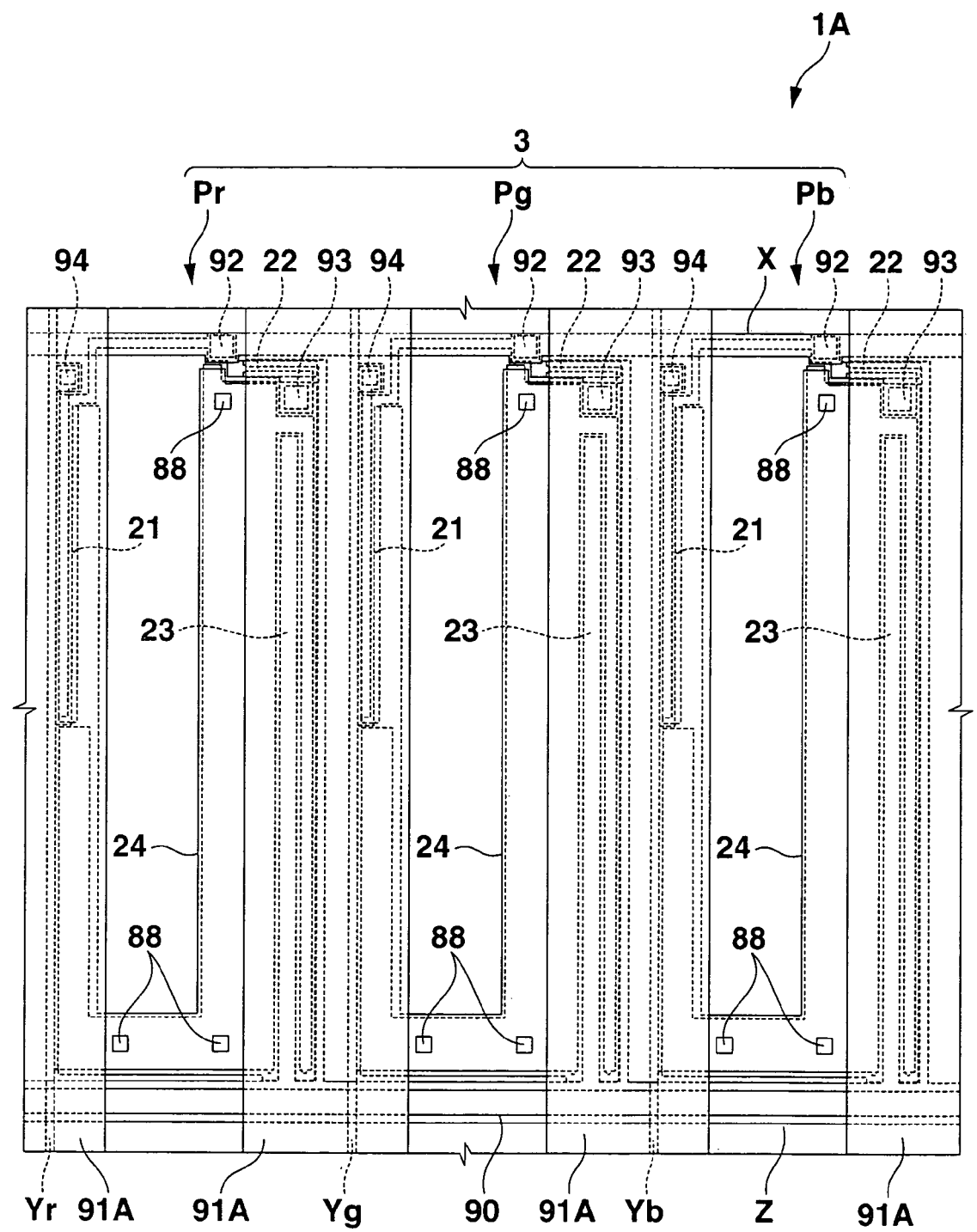
FIG. 16 is a schematic plan view of the pixel 3 including a red sub-pixel Pr, green sub-pixel Pg, and blue sub-pixel Pb continuously arrayed in the horizontal direction of the display panel 1.
Figure 17:
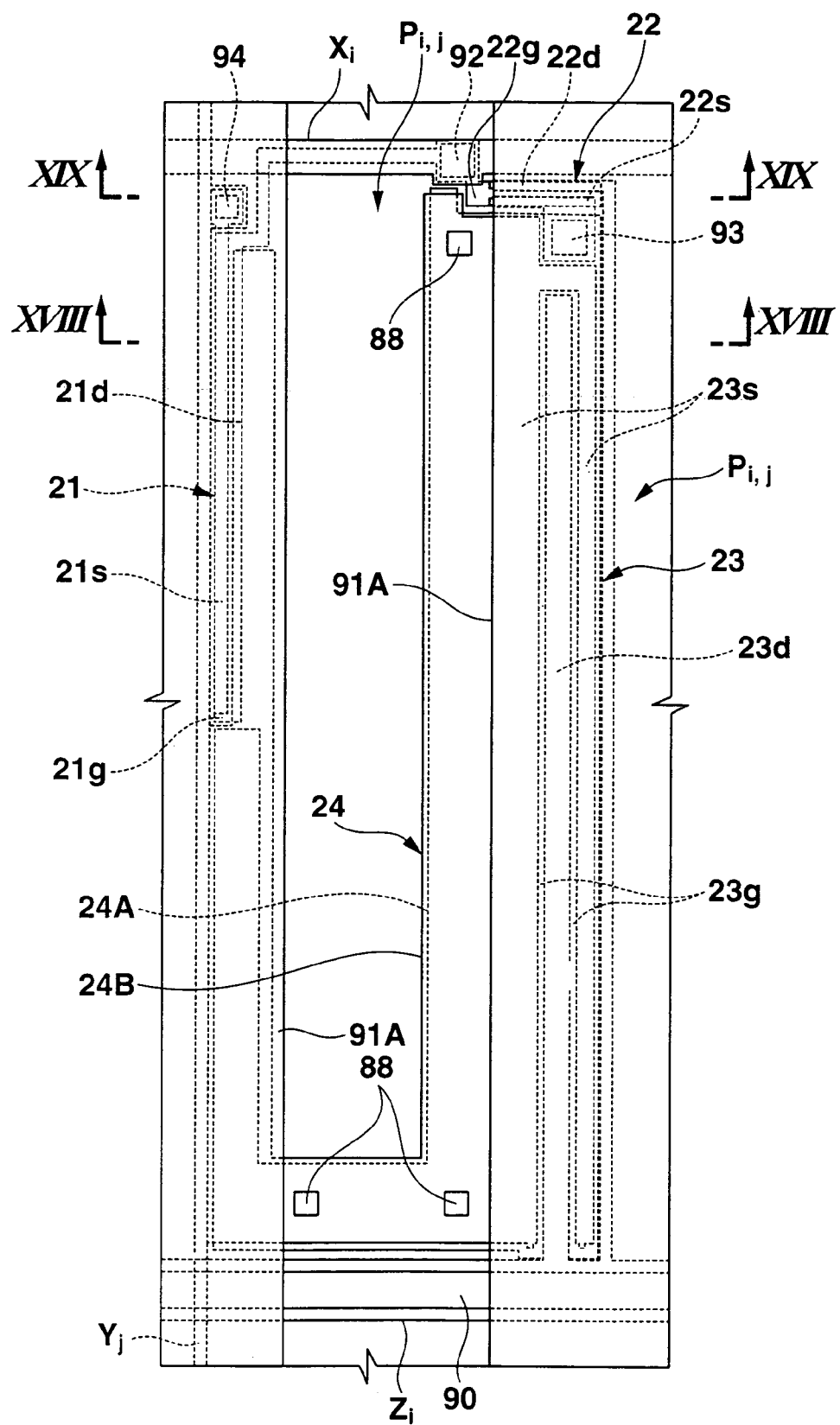
FIG. 17 is a plan view showing the electrodes of the sub-pixel P shown in FIG. 16.
Figure 18:
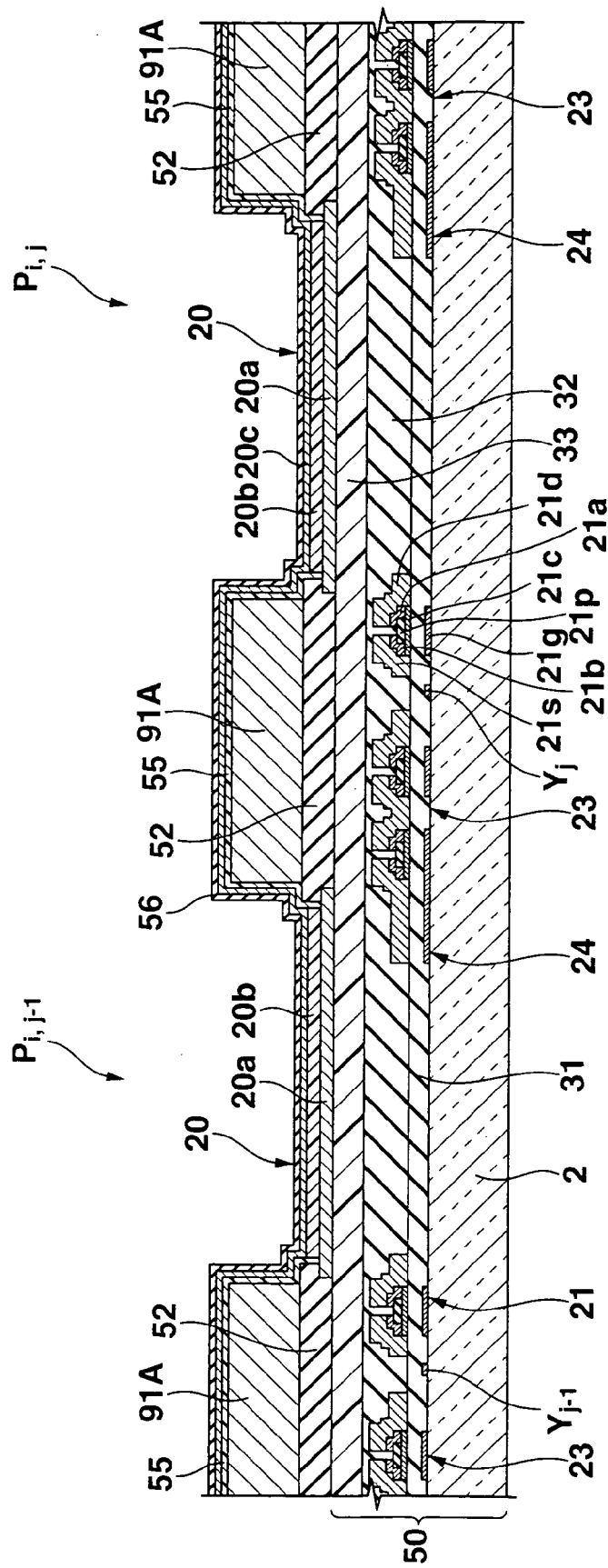
FIG. 18 is a sectional view taken along a line XVIII-XVIII in FIG. 17.
Figure 19:
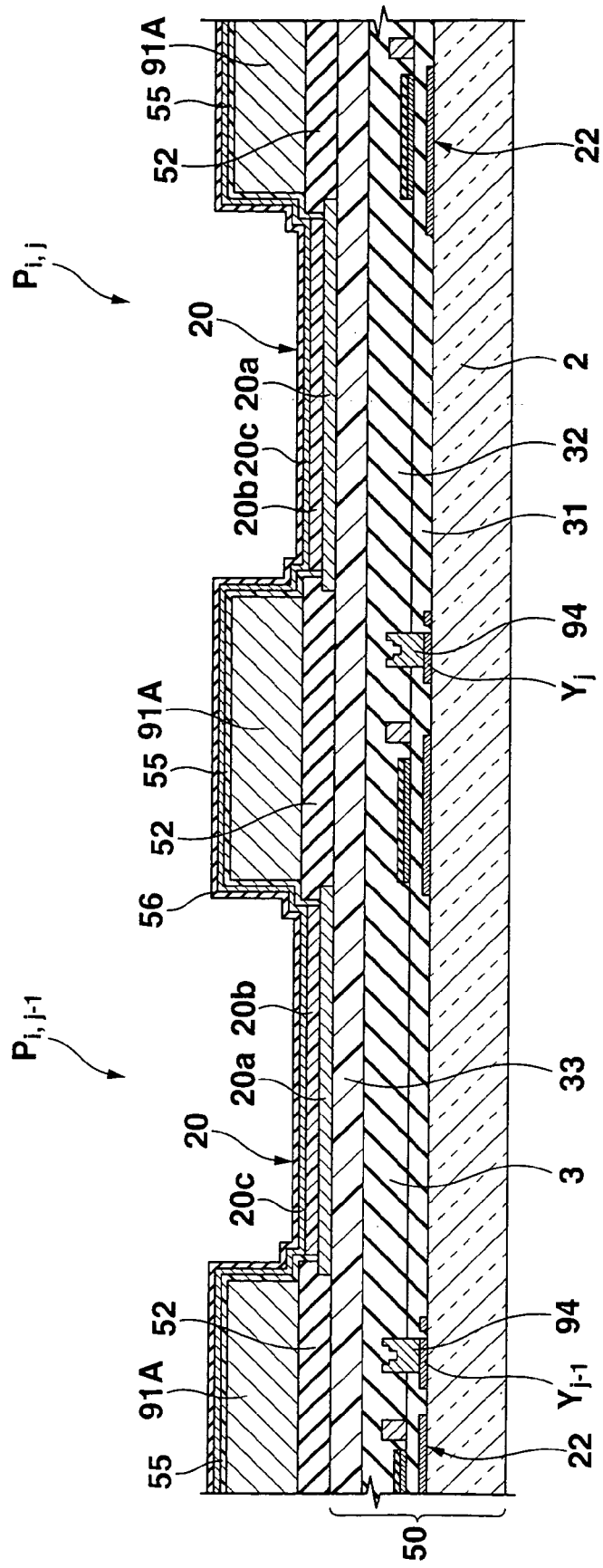
FIG. 19 is a sectional view taken along a line XIX-XIX in FIG. 17.
Figure 20:
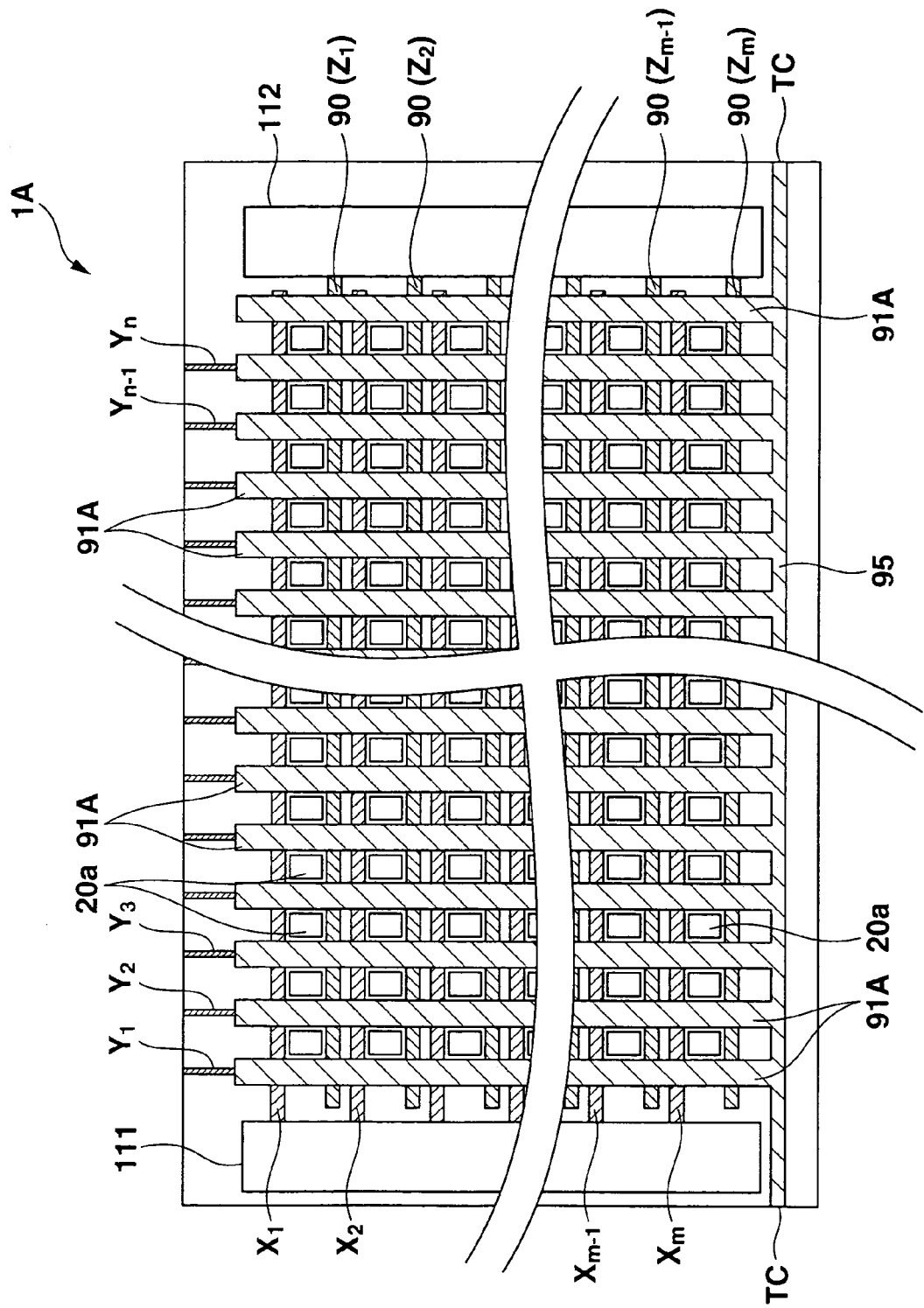
FIG. 20 is a schematic plan view showing the interconnection structure of a display panel of a modification.
Figure 21:
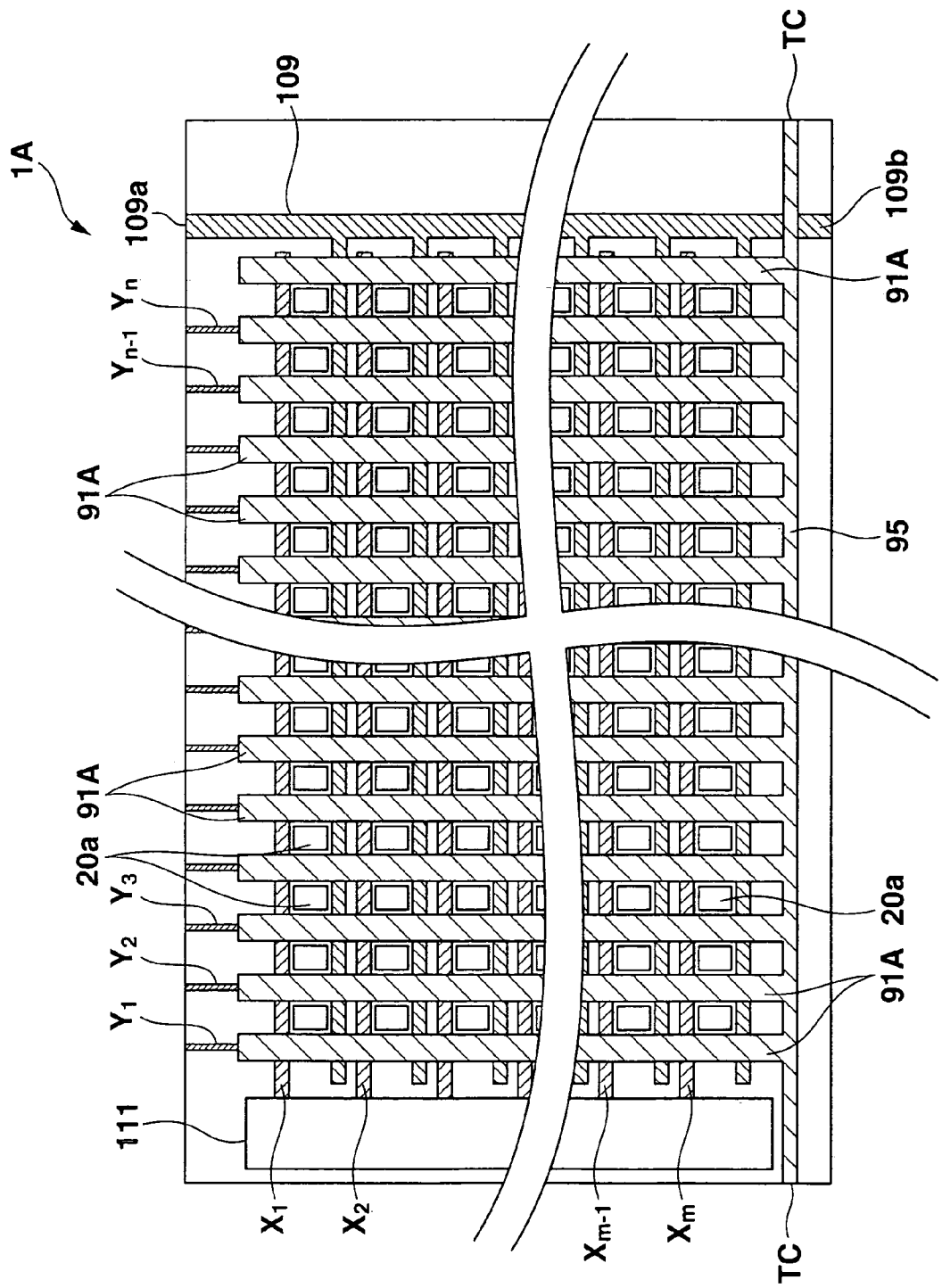
FIG. 21 is a schematic plan view showing the interconnection structure of another display panel of the modification.

In the above-described embodiment, the transistors 22 and 23 are covered with the common interconnection 91. As indicated by a display panel 1A shown in FIGS. 16 to 21, a common interconnection 91A of the kth column ($2 \leq k \leq n$) may cover the switch transistors 21 of the sub-pixels P of the kth column and a signal line $Y_k$ of the kth column in addition to the transistors 22 and 23 of the sub-pixels P of the (k−1)th column by making each of the (n+1) common interconnections 91A wider than the common interconnection 91. The common interconnection 91A of the first column covers the switch transistors 21 of the sub-pixels P of the first column and the signal line $Y_k$ of the first column. The common interconnection 91A of the (n+1)th column covers the transistors 22 and 23 of the sub-pixels P of the nth column. With this structure, the organic EL layer 20b does not overlap the drain-to-source paths of the transistors 21 to 23 when viewed from the upper side. For this reason, light from the organic EL layer 20b hardly enters from the drain-to-source paths of the transistors 21 to 23 to the semiconductor films 21c to 23c of the transistors 21 to 23. Hence, modulation of the transistors 21 to 23 by light incidence in them can be suppressed. FIG. 16 is a schematic plan view of the red sub-pixel Pr, green sub-pixel Pg, and blue sub-pixel Pb continuously arrayed in the horizontal direction. FIG. 17 shows the 1-dot sub-pixel P. FIG. 18 is a sectional view taken along a line XVIII-XVIII in FIG. 17. FIG. 19 is a sectional view taken along a line XIX-XIX in FIG. 17. FIG. 20 is a schematic plan view showing the interconnection structure of the display panel 1 of this modification. FIG. 21 is a schematic plan view showing the interconnection structure of another display panel 1 of this modification. The display panel 1 shown in FIG. 20 is operated in accordance with the waveform chart shown in FIG. 8, like the first display panel 1 in FIG. 7. The display panel 1 shown in FIG. 21 is operated in accordance with the waveform chart shown in FIG. 10, like the second display panel 1 in FIG. 9. The adjacent transistors 21 to 23 and the adjacent signal line Y are arranged inside the edge of the common interconnection 91A. The same reference numerals as in the display panel 1 of the above-described embodiment denote the same constituent elements in the display panel 1A, and a description thereof will be omitted.

[Second Modification]

In the above-described embodiment, the transistors 21 to 23 have been explained as N-channel field effect transistors. The transistors 21 to 23 may be P-channel field effect transistors. In this case, the relationship between the sources 21s, 22s, and 23s of the transistors 21 to 23 and the drains 21d, 22d, and 23d of the transistors 21 to 23 is reversed in the circuit diagram shown in FIG. 2. For example, when the driving transistor 23 is a P-channel field effect transistor, the drain 23d of the driving transistor 23 is electrically connected to the sub-pixel electrode 20a of the organic EL element 20. The source 23s is electrically connected to the supply line Z.

[Third Modification]

In the above-described embodiment, the three transistors 21 to 23 are provided per 1-dot pixel. The present invention can be applied to any display panel which has one or a plurality of transistors per 1-dot sub-pixel P and can be driven by using these transistors by the active driving method.

[Fourth Modification]

In the above-described embodiment, the signal line Y is patterned from the gate layer. Instead, the signal line Y may be patterned from the drain layer. In this case, the scan line X and supply line Z are patterned from the gate layer, and the signal line Y is arranged above the scan line X and supply line Z.

[Fifth Modification]

In the above-described embodiment, the organic EL layer 20b of the red sub-pixel Pr, the organic EL layer 20b of the green sub-pixel Pg, and the organic EL layer 20b of the blue sub-pixel Pb are repeatedly arrayed in this order for each column in the vertical direction. However, they need not always be arrayed in this order.

[Sixth Modification]

In the above-described embodiment, the counter electrode 20c is used as the cathode of the organic EL element 20, and the sub-pixel electrode 20a is used as the anode of the organic EL element 20. However, the counter electrode 20c may be used as the anode of the organic EL element 20, and the sub-pixel electrode 20a may be used as the cathode of the organic EL element 20.

[Seventh Modification]

In the above-described embodiment, the drain 22d of the holding transistor 22 is connected to the supply line Z. However, the present invention is not limited to this. The drain 22d of the holding transistor 22 may be connected to the scan line X and not electrically connected to the drain 23d of the driving transistor 23.

A plurality of above-described modifications may be combined if the consistency can be obtained.

What is claimed is:

1. A display panel comprising:
   a transistor array substrate which comprises a plurality of transistors, including driving transistors;
   a plurality of pixel electrodes which are electrically connected to said plurality of driving transistors, said plurality of pixel electrodes being provided by patterning a transparent conductive film;
   a plurality of light-emitting layers provided the pixel electrodes;
   a counter electrode which is provided on the light-emitting layers;
   a plurality of common interconnections, each of which is arranged between adjacent pixel electrodes and electrically connected to the counter electrode;
   an insulating film provided on the transistors;
   a plurality of feed interconnections, each of which is provided in a trench formed in the insulation film; and
   a portion of said transparent conductive film, which has been patterned to provide the pixel electrodes, mounted on each of the feed interconnections;
   wherein the pixel electrodes, the light emitting layers, and the counter electrode form a plurality of light emitting elements;
   wherein the light emitting elements and the driving transistors respectively connected thereto are connected in series; and
   wherein each pair of one of the light emitting elements and one of the driving transistors has a first end connected to one of the common interconnections, and a second end connected to one of the feed interconnections.

2. A panel according to claim 1, wherein the common interconnections are arranged above the driving transistors.

3. A panel according to claim 1, wherein the counter electrode is provided above the pixel electrodes and between adjacent pixel electrodes.

4. A panel according to claim 1, wherein the counter electrode is formed continuously from above the pixel electrodes to above the common interconnections.

5. A panel according to claim 1, wherein tops of the common interconnections are higher than surface levels of the light-emitting layers.

6. A panel according to claim 1, wherein the common interconnections are thicker than the counter electrode.

7. A panel according to claim 1, wherein the common interconnections are thicker than the pixel electrodes.

8. A panel according to claim 1, wherein the common interconnections are thicker than source/drain electrodes and gate electrodes of said plurality of transistors.

9. A panel according to claim 1, wherein the common interconnections are opaque.

10. A panel according to claim 1, wherein the pixel electrodes are transparent.

11. A panel according to claim 1, wherein said plurality of transistors include holding transistors, each of which holds a gate voltage of a corresponding one of the driving transistors in a light emission period.

12. A panel according to claim 1, wherein said plurality of transistors include switch transistors, each of which supplies a write current to a drain-to-source path of a corresponding one of the driving transistors.

13. A panel according to claim 1, wherein the feed interconnections extend perpendicularly to the common interconnections.

14. A panel according to claim 1, further comprising signal lines which supply write currents to the driving transistors.

15. A panel according to claim 14, wherein each of the signal lines is provided along one of the common interconnections without overlapping the common interconnection.

16. A panel according to claim 1, further comprising a plurality of supply lines formed by patterning a transparent conductive film for forming sources and drains of the transistors, wherein the feed interconnections are provided on the supply lines, respectively.

17. A display panel comprising:
a transistor array substrate which comprises a plurality of transistors, including driving transistors;
a plurality of pixel electrodes which are electrically connected to the driving transistors, said plurality of pixel electrodes being provided by patterning a transparent conductive film;
a plurality of light-emitting layers provided on the pixel electrodes;
a counter electrode which is provided on the light-emitting layers;
a plurality of common interconnections, which are arranged between adjacent pixel electrodes and electrically connected to the counter electrode, and which are formed from a conductive layer different from the transparent conductive film, a layer which forms sources and drains of said plurality of transistors, and a layer which forms as gates of said plurality of transistors;
an insulating film provided on the transistors;
a plurality of feed interconnections, each of which is provided in a trench formed in the insulation film; and
a portion of said transparent conductive film, which has been patterned to provide the pixel electrodes, mounted on each of the feed interconnections;
wherein the pixel electrodes, the light emitting layers, and the counter electrode form a plurality of light emitting elements;
wherein the light emitting elements and the driving transistors respectively connected thereto are connected in series; and
wherein each pair of one of the light emitting elements and one of the driving transistors has a first end connected to one of the common interconnections, and a second end connected to one of the feed interconnections.

18. A panel according to claim 17, further comprising a plurality of supply lines formed by patterning a transparent conductive film for forming the sources and drains of the transistors, wherein the feed interconnections are provided on the supply lines, respectively.

19. A display panel comprising:
a plurality of pixel electrodes, which are provided by patterning a transparent conductive film;
a plurality of light-emitting layers which are provided on said plurality of pixel electrodes;
a counter electrode provided on each of said plurality of light-emitting layers;
a plurality of driving transistors which are electrically connected to said plurality of pixel electrodes, respectively;
a plurality of switch transistors, each of which supplies a write current to a drain-to-source path of a corresponding one of said plurality of driving transistors;
a plurality of holding transistors, each of which holds a gate voltage of a corresponding one of said plurality of driving transistors;
a plurality of common interconnections, each of which is arranged between adjacent pixel electrodes and electrically connected to the counter electrode;
a plurality of signal lines which are electrically connected to the switch transistors, and which are arranged so as not to overlap the common interconnections;
an insulating film provided on the driving transistors, the switch transistors, and the holding transistors;
a plurality of feed interconnections, each of which is provided in a trench formed in the insulation film; and
a portion of said transparent conductive film, which has been patterned to provide the pixel electrodes, mounted on each of the feed interconnections;
wherein the pixel electrodes, the light emitting layers, and the counter electrodes form a plurality of light emitting elements;
wherein the light emitting elements and the driving transistors respectively connected thereto are connected in series; and
wherein each pair of one of the light emitting elements and one of the driving transistors has a first end connected to one of the common interconnections, and a second end connected to one of the feed interconnections.

20. A panel according to claim 19, wherein the common interconnections are formed from a conductive layer different from the transparent conductive film, a layer which forms sources and drawings of the driving transistors, and a layer which forms gates of the driving transistors.

21. A panel according to claim 19, further comprising a plurality of supply lines formed by patterning a transparent conductive film for forming sources and drains of the transistors, wherein the feed interconnections are provided on the supply lines, respectively.

* * * * *